United States Patent
Shishido et al.

(10) Patent No.: US 8,154,480 B2
(45) Date of Patent: Apr. 10, 2012

(54) PHOTOELECTRIC CONVERSION DEVICE AND ELECTRONIC DEVICE HAVING THE SAME

(75) Inventors: Hideaki Shishido, Kanagawa (JP); Atsushi Hirose, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 898 days.

(21) Appl. No.: 12/176,732

(22) Filed: Jul. 21, 2008

(65) Prior Publication Data

US 2009/0027372 A1    Jan. 29, 2009

(30) Foreign Application Priority Data

Jul. 25, 2007   (JP) ................................. 2007-193015
Jul. 25, 2007   (JP) ................................. 2007-193151

(51) Int. Cl.
    *G01J 1/02*       (2006.01)
    *H01L 31/10*     (2006.01)
    *H04N 5/335*    (2011.01)
(52) U.S. Cl. ..... 345/76; 345/207; 250/214 A; 250/214.1
(58) Field of Classification Search ............ 345/89, 345/92, 94, 98, 100, 76, 207; 326/68; 328/58, 328/83, 95, 98; 250/214 A, 214.1
See application file for complete search history.

(56) References Cited

U.S. PATENT DOCUMENTS

| | | | |
|---|---|---|---|
| 4,409,134 A | 10/1983 | Yamazaki | |
| 4,498,001 A | 2/1985 | Smoot | |
| 4,812,726 A | 3/1989 | Benii et al. | |
| 5,004,901 A * | 4/1991 | Yoshimoto et al. | 250/201.5 |
| 5,241,575 A * | 8/1993 | Miyatake et al. | 377/60 |
| 5,317,143 A | 5/1994 | Yoshimoto et al. | |
| RE34,658 E | 7/1994 | Yamazaki et al. | |
| RE34,769 E * | 11/1994 | Yoshimoto et al. | 250/201.5 |
| 5,381,146 A | 1/1995 | Kolte | |
| 5,473,467 A | 12/1995 | Miller | |
| 5,936,231 A | 8/1999 | Michiyama et al. | |

(Continued)

FOREIGN PATENT DOCUMENTS

EP          0 692 868        1/1996

(Continued)

OTHER PUBLICATIONS

Johns, et al., Analog Integrated Circuit Design, 1997, John Wiley and Sons, 1st Ed., pp. 135, 16-147, 249, 251.*

(Continued)

*Primary Examiner* — Quan-Zhen Wang
*Assistant Examiner* — Michael J Eurice
(74) *Attorney, Agent, or Firm* — Fish & Richardson P.C.

(57) ABSTRACT

A plurality of transistors in which ratios of a channel length L to a channel width W, $\alpha=W/L$, are different from each other is provided in parallel as output side transistors 105a to 105c in a current mirror circuit 101 which amplifies a photocurrent of a photoelectric conversion device and an internal resistor is connected to each of the output side transistors 105a to 105c in series. The sum of currents which flow through the plurality of transistors and the internal resistor is output, whereby a transistor with large amount of $\alpha$ can be driven in a linear range with low illuminance, and a transistor with small amount of $\alpha$ can be driven in a linear range with high illuminance, so that applicable illuminance range of the photoelectric conversion device can be widened.

32 Claims, 22 Drawing Sheets

U.S. PATENT DOCUMENTS

| | | | |
|---|---|---|---|
| 6,243,155 B1 | 6/2001 | Zhang et al. | |
| 6,287,888 B1 | 9/2001 | Sakakura et al. | |
| 6,495,816 B1 | 12/2002 | Brodeur | |
| 6,521,882 B1 | 2/2003 | Sumiya et al. | |
| 6,642,500 B2 | 11/2003 | Takahashi | |
| 7,030,551 B2 | 4/2006 | Yamazaki et al. | |
| 7,253,391 B2* | 8/2007 | Koyama et al. | 250/214 C |
| 7,602,387 B2* | 10/2009 | Fish | 345/207 |
| 2002/0011978 A1 | 1/2002 | Yamazaki et al. | |
| 2004/0101309 A1 | 5/2004 | Beyette et al. | |
| 2005/0082463 A1* | 4/2005 | Koyama et al. | 250/214 R |
| 2005/0100977 A1 | 5/2005 | Yang et al. | |
| 2005/0167573 A1* | 8/2005 | Maruyama et al. | 250/214.1 |
| 2006/0044300 A1 | 3/2006 | Koyama et al. | |
| 2006/0186497 A1 | 8/2006 | Nishi et al. | |
| 2006/0220252 A1 | 10/2006 | Yukawa et al. | |
| 2006/0260675 A1 | 11/2006 | Sugawara et al. | |
| 2006/0261253 A1* | 11/2006 | Arao et al. | 250/214.1 |
| 2006/0262054 A1 | 11/2006 | Yamazaki et al. | |
| 2007/0045672 A1* | 3/2007 | Nishi et al. | 257/257 |
| 2007/0113886 A1 | 5/2007 | Arao et al. | |
| 2007/0187790 A1 | 8/2007 | Takahashi et al. | |
| 2007/0257248 A1 | 11/2007 | Arao et al. | |
| 2007/0267665 A1 | 11/2007 | Koyama et al. | |
| 2008/0001148 A1 | 1/2008 | Nishi et al. | |
| 2008/0078923 A1 | 4/2008 | Hirose | |
| 2008/0099664 A1 | 5/2008 | Yamazaki et al. | |
| 2008/0158137 A1 | 7/2008 | Yoshida | |
| 2008/0237665 A1 | 10/2008 | Shishido | |
| 2008/0237669 A1 | 10/2008 | Yanagisawa et al. | |
| 2009/0001256 A1 | 1/2009 | Yanagosawa et al. | |

FOREIGN PATENT DOCUMENTS

| | | | |
|---|---|---|---|
| JP | 3192764 A | | 8/1991 |
| JP | 07-070064 | | 7/1995 |
| JP | 08-054587 | | 2/1996 |
| JP | 08-289205 | | 11/1996 |
| JP | 1996-289205 A | * | 11/1996 |
| JP | 8289205 A | | 11/1996 |
| JP | 09-329493 | | 12/1997 |
| JP | 11-088770 | | 3/1999 |
| JP | 1999-088770 A | * | 3/1999 |
| JP | 11088770 A | | 3/1999 |
| JP | 2000-258244 | | 9/2000 |
| JP | 3444093 | | 9/2003 |
| JP | 2005-129909 | | 5/2005 |
| JP | 2006352098 A | | 12/2006 |
| JP | 2007-059889 | | 3/2007 |
| JP | 2007-073591 | * | 3/2007 |
| JP | 2007-073591 A | * | 3/2007 |
| JP | 2007073591 A | | 3/2007 |
| WO | 2007/013534 | | 2/2007 |

OTHER PUBLICATIONS

Johns, et al., Analog Integrated Circuit Design, 1997, John Wiley and Sons, 1st Ed., pp. 135, 146-147, 249, 251.*

International Search Report (Application No. PCT/JP2008/063224); dated Aug. 26, 2008; 3 pages.

Written Opinion (Application No. PCT/JP2008/063224); dated Aug. 26, 2008; 6 pages.

* cited by examiner

PHOTOELECTRIC CONVERSION DEVICE AND ELECTRONIC DEVICE HAVING THE SAME

TECHNICAL FIELD

The present invention relates to a photoelectric conversion device and especially relates to a photoelectric conversion device including a thin film semiconductor element, and an electronic device provided with the photoelectric conversion device.

BACKGROUND ART

A large number of photoelectric conversion devices generally used for detecting an electromagnetic wave are known. For example, photoelectric conversion devices having sensitivity to light from ultra-violet rays to infrared rays are referred to as optical sensors in general. Among them, an optical sensor having sensitivity in a visible light region with a wavelength of 400 to 700 nm is particularly referred to as a visible light sensor, and a large number of visible light sensors are used for devices which need illuminance adjustment, on/off control, or the like depending on human living environment.

In some display devices, ambient brightness of the display device is detected to adjust display luminance. This is because unnecessary electric power of the display device can be reduced by detecting ambient brightness by an optical sensor and obtaining appropriate display luminance. For example, examples of display devices which have an optical sensor for adjusting luminance include mobile phone and computer.

In addition, not only ambient brightness but also luminance of a display device, in particular, luminance of a backlight of a liquid crystal display device is detected by an optical sensor to adjust luminance of a display screen.

In an optical sensor, a photoelectric conversion element such as a photodiode is used for a light sensing part, and an output current of the photoelectric conversion element is amplified in an amplifier circuit. For example, a current mirror circuit is used as the amplifier circuit of the optical sensor (for example, see Reference 1: Japanese Patent No. 3444093).

DISCLOSURE OF INVENTION

An optical sensor shown in Reference 1 can detect weak light with a circuit for amplifying the photocurrent. However, when weak light to strong light is detected, the range of output current becomes wider, and output voltage increases in linear proportion to illuminance in the case where the output current is converted into voltage by an external load resistor or the like. Accordingly, when the output voltage with respect to the wide range of illuminance is obtained, the output voltage with respect to illuminance is several mV for weak light, and is several V for strong light. Therefore, there is a problem in that wide dynamic range cannot be obtained.

In order to solve the above-described problem, a photoelectric conversion device of the present invention enables an applicable illuminance range to be widened by providing a plurality of transistors in parallel whose ratios of channel length L to channel width W, $\alpha=W/L$, are different from each other as transistors on the output side (hereinafter referred to as output side transistors) of a current mirror circuit which amplifies a photocurrent.

In the photoelectric conversion device of the present invention, a plurality of transistors whose ratios of channel length L to channel width W, $\alpha=W/L$, are different from each other are provided in parallel as output side transistors of a current mirror circuit which amplifies a photocurrent. When an internal resistor is connected to each of the output side transistors in series and the total sum of currents which flow through the plurality of transistors is output, a transistor with large amount of a can be driven with low illuminance in a linear region, and a transistor with small amount of a can be driven with high illuminance in a linear region; by using this, the photoelectric conversion device of the present invention can have a wider applicable illuminance range.

BEST MODE FOR CARRYING OUT THE INVENTION

Figure 1:
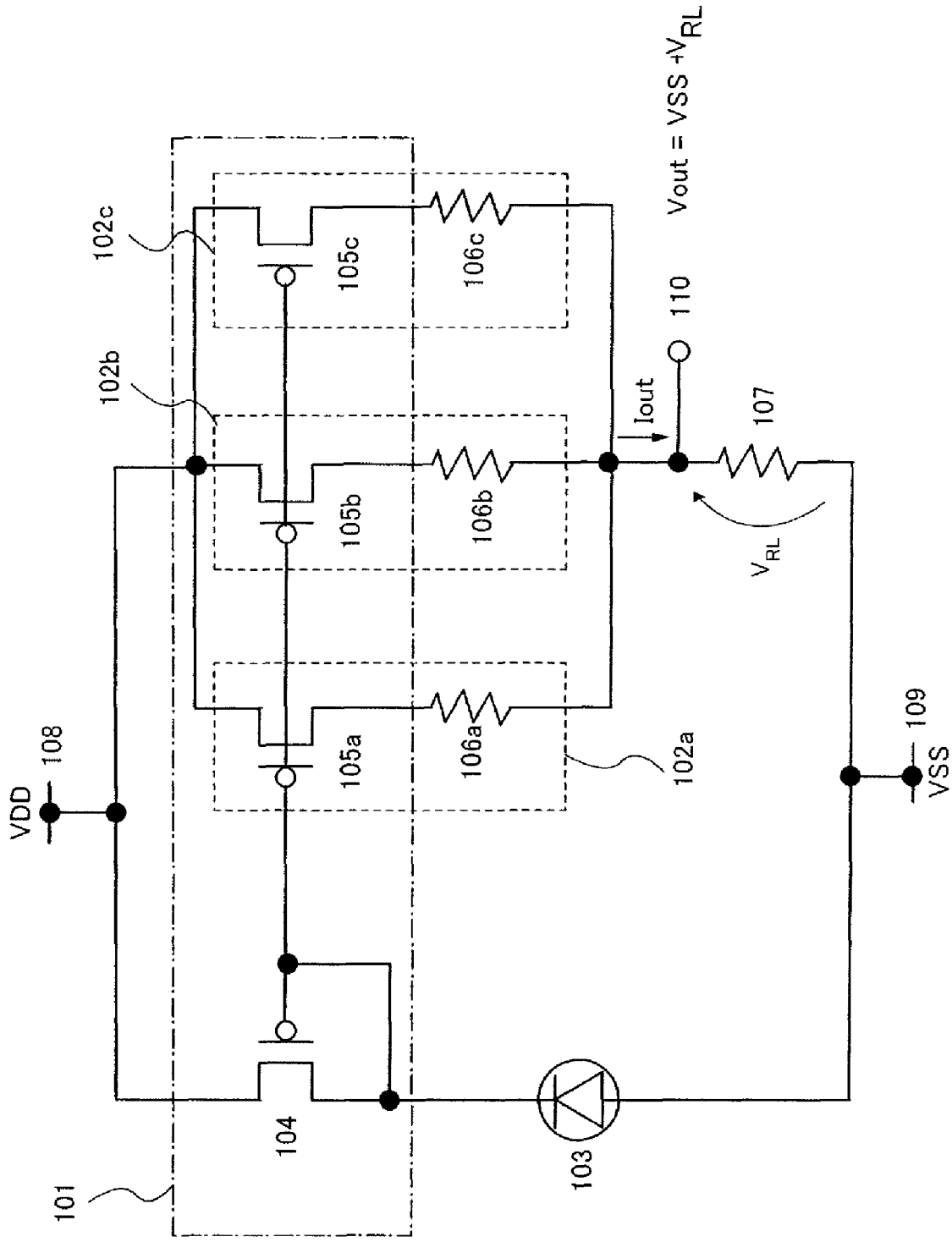
FIG. 1 is a diagram illustrating a circuit configuration of a photoelectric conversion device of the present invention.

Hereinafter, embodiment modes of the present invention will be described with reference to the drawings. However, the present invention can be embodied in many different modes and it is easily understood by those skilled in the art that modes and details can be variously changed without departing from the scope and the spirit of the present invention. Therefore, the present invention should not be limited to the descriptions of the embodiment modes below. In all the drawings used for describing the embodiment modes, the same portions or portions having similar functions may be denoted by the same reference numerals, and the repeated description thereof will be omitted.

Note that it is difficult to distinguish a source electrode and a drain electrode because of a structure of a transistor. Further, levels of a potential are switched depending on an operation of a circuit in some cases. Therefore, in this specification, a source electrode and a drain electrode are each referred to as a first electrode or a second electrode without particular identification. For example, when the first electrode is a source electrode, the second electrode refers to a drain electrode, whereas the second electrode refers to a source electrode when the first electrode is a drain electrode.

Note that "connected" in this specification is a synonymous with "electrically connected." Therefore, in a structure disclosed by the present invention, in addition to a predetermined connection relation, other elements that enable electrical connection therebetween (for example, another element or switch) may also be disposed.

Embodiment Mode 1

This embodiment mode will be described with reference to accompanying drawings. FIG. 1 illustrates a circuit configuration of a photoelectric conversion device in Embodiment Mode 1 of the present invention.

The photoelectric conversion device in this embodiment mode includes a photoelectric conversion element 103, a current mirror circuit 101 which is an amplifier circuit for amplifying an output current (also referred to as a photocurrent) from the photoelectric conversion element 103, three internal resistors 106a to 106c, a load resistor 107, a high potential side power supply line 108, a low potential side power supply line 109, and an output terminal 110. The current mirror circuit 101 includes a reference side transistor 104 and three output side transistors 105a to 105c.

Note that in FIG. 1, the reference side transistor 104 and the output side transistors 105a to 105c are p-channel field effect transistors.

Note that in this specification, a power supply potential on a high potential side is denoted as VDD, and a power supply potential on a low potential side is denoted as VSS.

In FIG. 1, a first electrode and a gate electrode of the reference side transistor 104 are diode-connected to each other. The first electrode of the reference side transistor 104 is connected to a cathode of the photoelectric conversion element 103, the gate electrode of the reference side transistor 104 is connected to each of gate electrodes of the three output side transistors 105a to 105c, and a second electrode of the reference side transistor 104 is connected to the high potential side power supply line 108.

A first electrode of the output side transistor 105a is connected to one terminal of the internal resistor 106a, and a second electrode of the output side transistor 105a is connected to the high potential side power supply line 108. The other terminal of the internal resistor 106a is connected to one terminal of the load resistor 107. In this specification, a circuit in which the output side transistor 105a and the internal resistor 106a are connected in series is referred to as an output generation circuit 102a.

In a similar manner, a first electrode of the output side transistor 105b is connected to one terminal of the internal resistor 106b, and a second electrode of the output side transistor 105b is connected to the high potential side power supply line 108. The other terminal of the internal resistor 106b is connected to one terminal of the load resistor 107. In this specification, a circuit in which the output side transistor 105b and the internal resistor 106b are connected in series is referred to as an output generation circuit 102b.

In a similar manner, a first electrode of the output side transistor 105c is connected to one terminal of the internal resistor 106c, and a second electrode of the output side transistor 105c is connected to the high potential side power supply line 108. The other terminal of the internal resistor 106c is connected to one terminal of the load resistor 107. In this specification, a circuit in which the output side transistor 105c and the internal resistor 106c are connected in series is referred to as an output generation circuit 102c.

One terminal of the load resistor 107 is connected to the output terminal 110. An anode of the photoelectric conversion element 103 and the other terminal of the load resistor 107 are connected to the low potential side power supply line 109.

Next, operation of the photoelectric conversion device of this embodiment mode will be described.

The photoelectric conversion element 103 outputs a photocurrent corresponding to the illuminance of light which is incident on the photoelectric conversion element 103. As the illuminance increases, the photocurrent output from the photoelectric conversion element 103 increases. When the photocurrent output from the photoelectric conversion element 103 flows to the reference side transistor 104, a potential difference is made between a gate and a source of the reference side transistor 104. The potential difference is applied between a gate and a source of each of the output side transistors 105a to 105c. In the current mirror circuit 101, the same voltage is applied to the gate electrodes of the reference side transistor 104 and the output side transistors 105a to 105c so that a current which flows through the output side transistors 105a to 105c is controlled with the photocurrent which has flowed through the reference side transistor 104 as a reference.

A current in accordance with the photocurrent flows through the output side transistors 105a to 105c, whereby output currents are generated in the output generation circuits 102a to 102c. Operation of the output generation circuits 102a to 102c will be described later. The sum of the output currents generated by the plurality of output generation circuits 102a to 102c flows through the load resistor 107. Thus, a potential difference is made between the terminals of the load resistor 107. When the potential difference is $V_{RL}$ and an output voltage is Vout, a voltage of Vout=$V_{RL}$+VSS, is output from the output terminal 110.

Next, the operation of the output generation circuits 102a to 102c will be described with reference to FIGS. 2 to 4.

Figure 2:
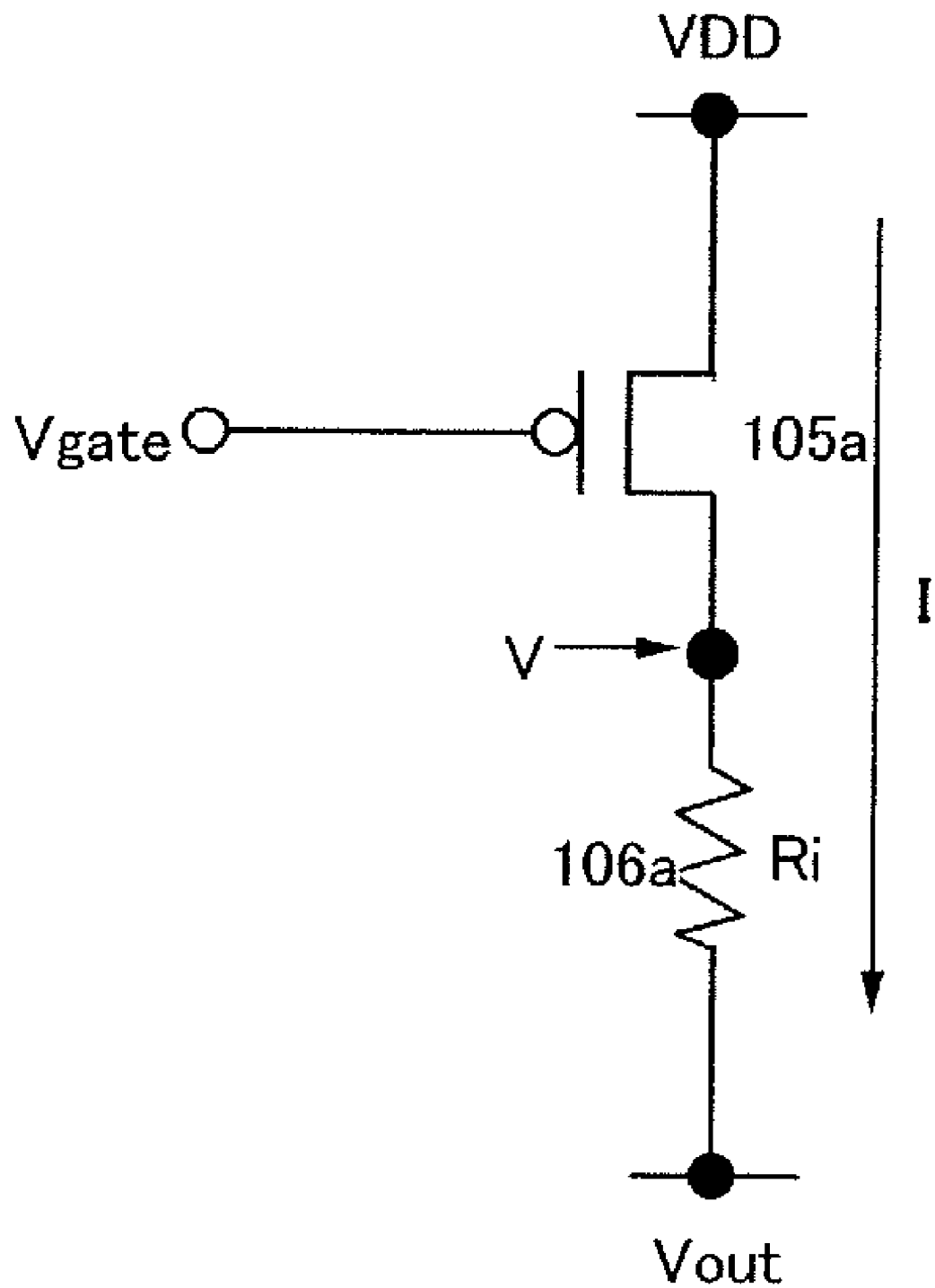
FIG. 2 is a diagram illustrating a configuration of an output generation circuit in the photoelectric conversion device of the present invention.

FIG. 2 is a diagram illustrating a structure of the output generation circuit 102a. The output side transistor 105a and the internal resistor 106a are connected in series. A gate voltage which is generated in accordance with the photocurrent is applied to a gate electrode of the output side transistor 105a. The gate voltage is denoted as Vgate. In addition, a potential of a second electrode of the internal resistor 106a is the output potential Vout.

Figure 3:
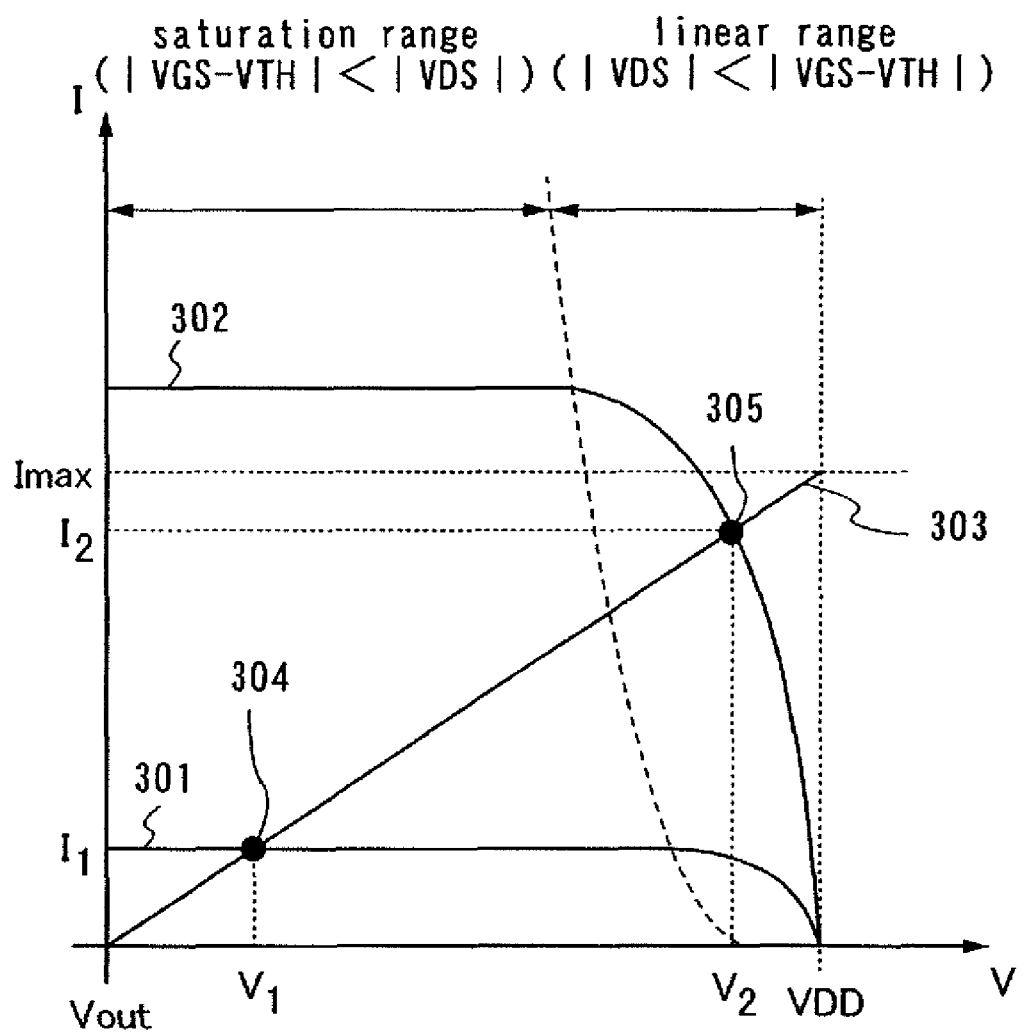
FIG. 3 is a diagram illustrating a voltage-current characteristic of the output generation circuit in the photoelectric conversion device of the present invention.

FIG. 3 shows voltage-current characteristics of the output side transistor 105a and the internal resistor 106a, in which a current which flows through the output generation circuit 102a is I and a potential of a connection portion between the output side transistor 105a and the internal resistor 106a is V. In FIG. 3, a vertical axis represents a current and a horizontal axis represents a voltage. In FIG. 3, a curve 301 represents a voltage-current characteristic of the output side transistor 105a in the case where light with an illuminance $L_1$ (a unit: lux) is incident on the photoelectric conversion element. A curve 302 represents a voltage-current characteristic of the output side transistor 105a in the case where light with an illuminance of $L_2$ ($L_1 < L_2$) is incident on the photoelectric conversion element. In addition, a straight line 303 represents a voltage-current characteristic of the internal resistor 106a. The output generation circuit 102a operates with the voltage V and the current I which correspond to an intersection (this is referred to as an operation point) of the curve showing the voltage-current characteristic of the output side transistor 105a and the straight line showing the voltage-current characteristic of the internal resistor 106a.

When the light with the illuminance $L_1$ enters, the output side transistor 105a has the voltage-current characteristic shown by the curve 301 and an operation point of the output generation circuit 102a is a point 304 which is an intersection of the curve 301 and the straight line 303. Then, a current $I_1$ flows through the output generation circuit 102a.

At that time, the output side transistor 105a operates in a saturation range. The saturation range is a range in which a magnitude relation of a voltage VGS between the gate and the source, a voltage VDS between a drain and the source, and a threshold voltage VTH of the output side transistor 105a is |VGS−VTH|<|VDS|. In this range, a current which depends only on the voltage VGS between the gate and the source of the output side transistor 105a flows through the output side transistor 105a. Therefore, a current which is in proportion to the illuminance flows through the output generation circuit 102a.

In the case where light with the illuminance which is higher than the illuminance $L_1$ enters, a current which is in proportion to the illuminance flows through the output generation circuit 102a when the illuminance is within a range in which the output side transistor 105a operates in the saturation range.

In the case where the illuminance is further increased and light with the illuminance $L_2$ enters, the output side transistor 105a has the voltage-current characteristic shown by the curve 302. At that time, an operation point of the output generation circuit 102a is a point 305 and a current $I_2$ flows through the output generation circuit 102a.

At that time, the output side transistor 105a operates in a linear range. The linear range is a range in which a magnitude relation of the voltage VGS between the gate and the source, the voltage VDS between the drain and the source, and the threshold voltage VTH of the output side transistor 105a is |VGS−VTH|>|VDS|. In this range, a current which depends on the voltage VGS between the gate and the source and the voltage VDS between the drain and the source of the output side transistor 105a flows through the output side transistor 105a. Therefore, the current which flows through the output generation circuit 102a is not in proportion to the illuminance and gradually becomes closer to Imax. Note that Imax is represented by (VDD−Vout)/Ri. It is to be noted that Ri is a resistance value of the internal resistor 106.

Figure 4:
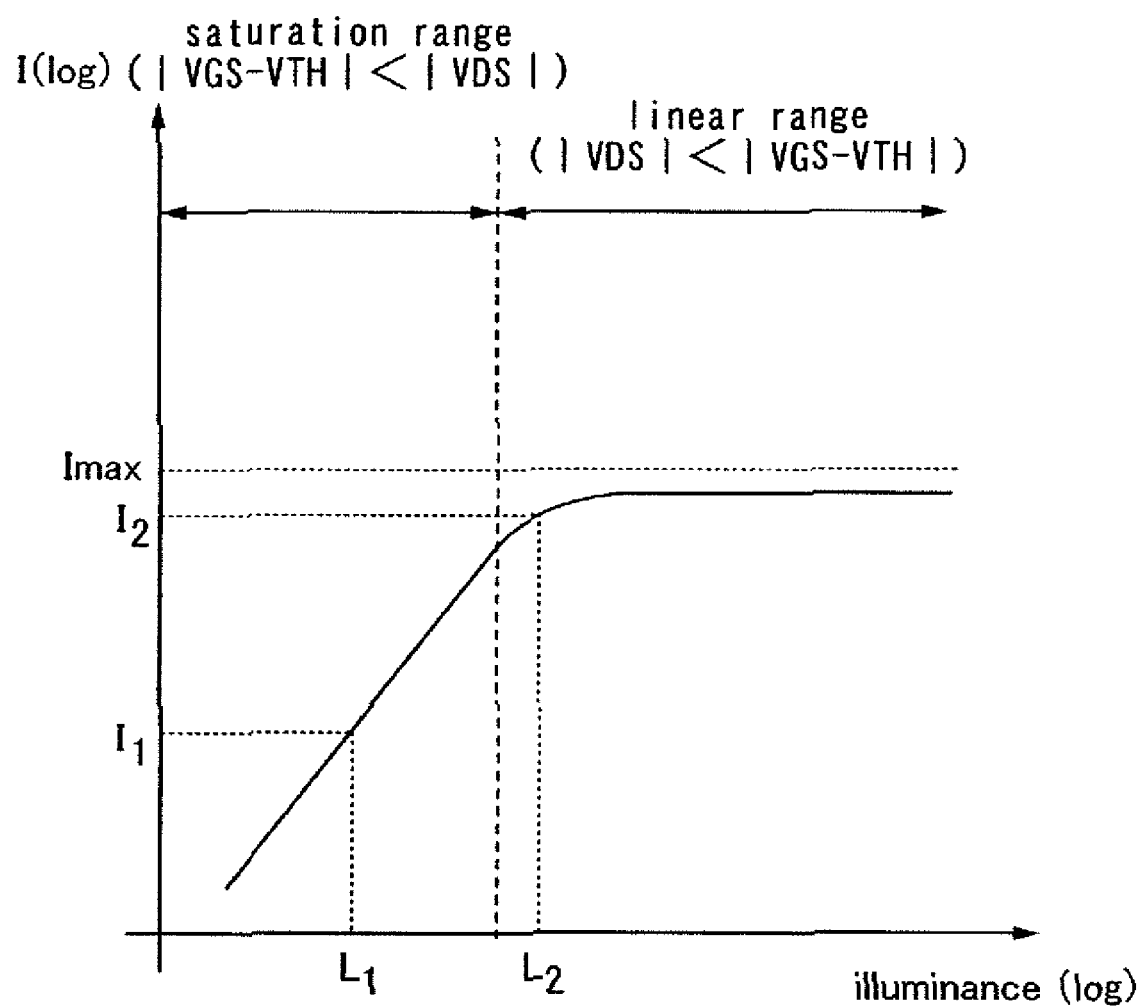
FIG. 4 is a diagram illustrating an illuminance-current characteristic of the output generation circuit in the photoelectric conversion device of the present invention.

Here, an illuminance-current characteristic of the output generation circuit 102a is shown in FIG. 4. In FIG. 4, a horizontal axis represents an illuminance and a vertical axis represents the current which flows through the output generation circuit 102a. Both of them are represented in a logarithm scale.

As described above, a current which is in proportion to the illuminance flows through the output generation circuit 102a when the illuminance is within a range in which the output side transistor 105a operates in the saturation range (for example, the illuminance $L_1$). On the other hand, when the illuminance is within a range in which the output side transistor 105a operates in the linear range (for example, the illuminance $L_2$), the current which flows through the output generation circuit 102a is not in proportion to the illuminance and gradually becomes closer to Imax.

Although the output generation circuit 102a has been described so far, the output generation circuit 102b and the output generation circuit 102c also operate in a similar manner.

Next, the operation of the photoelectric conversion device of this embodiment mode will be described again. In the photoelectric conversion device of this embodiment mode, a plurality of output generation circuits which perform the operation described above is connected in parallel. Here, operation of the circuits in the case where the three output generation circuits 102a to 102c are connected in parallel as shown in FIG. 1 will be described.

In the three output generation circuits 102a to 102c, ratios of a channel length L to a channel width W, α=W/L, of the output side transistors 105a to 105c are made different from each other. For example, α of the first output side transistor 105a is $α_1$, α of the second output side transistor 105b is $α_2$, and the α of the third output side transistor 105c is $α_3$. A magnitude relation thereof is $α_1 > α_2 > α_3$. Preferably, α is set as follows: $α_1/α_2$=approximately 10 and $α_2/α_3$=approximately 10.

Note that resistance values of the internal resistors 106a to 106c are set to be the same for convenience of explanation. However, the resistance values of the internal resistors 106a to 106c are not limited thereto and may be different from each other.

Figure 5A:
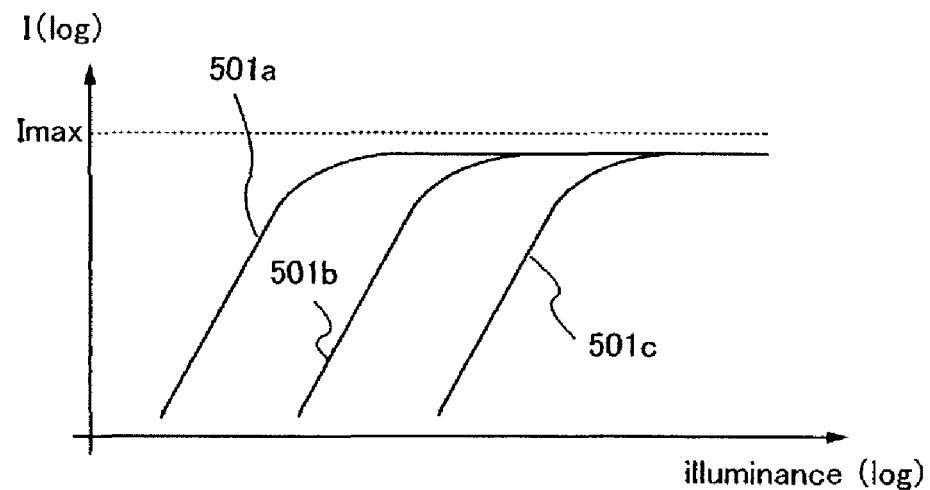
FIG. 5A is a diagram illustrating an illuminance-current characteristic of the output generation circuit.
Figure 5B:
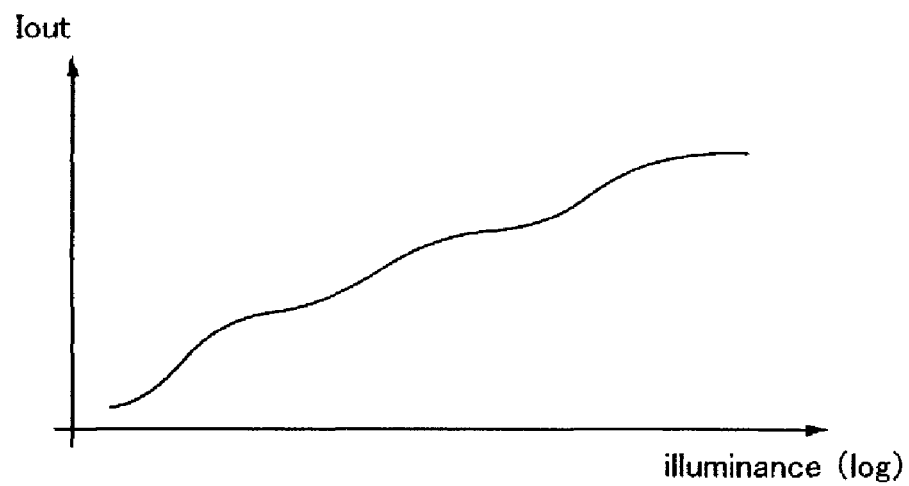
FIG. 5B is a diagram illustrating a sum of illuminance-current characteristics of the output generation circuits.
Figure 5C:
FIG. 5C is a diagram illustrating a sum of illuminance-voltage characteristics of the output generation circuits in the photoelectric conversion device of the present invention.

Operation of the circuit shown in FIG. 1 in that case is illustrated in FIGS. 5A to 5C. FIG. 5A shows illuminance-current characteristics of the output generation circuits 102a to 102c. In FIG. 5A, a horizontal axis represents an illuminance and a vertical axis represents currents which flow through the output generation circuits 102a to 102c. Both of them are represented in a logarithm scale.

Note that a curve 501a represents the illuminance-current characteristic of the first output generation circuit 102a, a curve 501b represents the illuminance-current characteristic of the second output generation circuit 102b, and a curve 501c represents the illuminance-current characteristic of the third output generation circuit 102c.

In the output generation circuits 102a to 102c, as α of the output side transistors 105a to 105c becomes larger, the output side transistors 105a to 105c can be driven in the linear range with a lower illuminance because each of the output side transistors 105a to 105c is connected to one of the internal resistors 106a to 106c in series. Therefore, as a of the output side transistors 105a to 105c becomes larger, the current which flows through the output generation circuits 102a to 102c hits a peak with a lower illuminance.

The sum of the currents which flow through the output generation circuits 102a to 102c is an output current (the output current is denoted as Iout) of the photoelectric conversion device of this embodiment mode. Then, the output current flows through the load resistor 107 and a sum of a potential difference generated in the load resistor 107 and VSS is output as the output voltage Vout.

Here, the sum (the output current) of the currents which flow through the output generation circuits 102a to 102c is shown in FIG. 5B. In addition, the output voltage Vout is shown in FIG. 5C. In FIGS. 5B and 5C, a horizontal axis represents the illuminance which is shown in a logarithm scale and a vertical axis represents the output current or the output voltage which is shown in a linear scale.

Since the output current Iout is the sum of the currents which flow through the output generation circuit 102a to 102c, the output current Iout has a characteristic which is almost in proportion to a logarithm of the illuminance as shown in FIG. 5B. In addition, the output voltage Vout also has a characteristic which is in almost proportion to the logarithm of the illuminance.

In this manner, in the photoelectric conversion device of this embodiment mode, an output which is almost in proportion to a logarithm of illuminance can be obtained and an illuminance range applicable for the photoelectric conversion device can be widened.

Although three output generation circuits are connected in parallel in the circuit shown in FIG. 1, the number of the output generation circuits are not limited thereto as long as a plurality of the output generation circuits is provided. By increasing the number of the output generation circuits, the illuminance range which is applicable for the photoelectric conversion device can be widened and a change in the output with respect to the illuminance can be made small.

Note that the load resistor 107 may be incorporated in the photoelectric conversion device or an external resistor such as a chip resistor can be attached as the load resistor 107. When the load resistor 107 is incorporated in the photoelectric conversion device, the external resistor is not necessary, whereby the number of steps and parts for connecting the external resistor can be reduced. In addition, since an area for the external resistor is unnecessary, an area of a photoelectric conversion portion of an electronic device or the like can be made small. On the other hand, when the load resistor 107 is an external resistor, influence of a variation in a load resistance (especially a variation in resistance with respect to temperature) can be suppressed.

Although the circuit shown in FIG. 1 is formed of p-channel transistors, n-channel transistors can also be used. A circuit configuration in which n-channel transistors are used is shown in FIG. 6.

Figure 6:
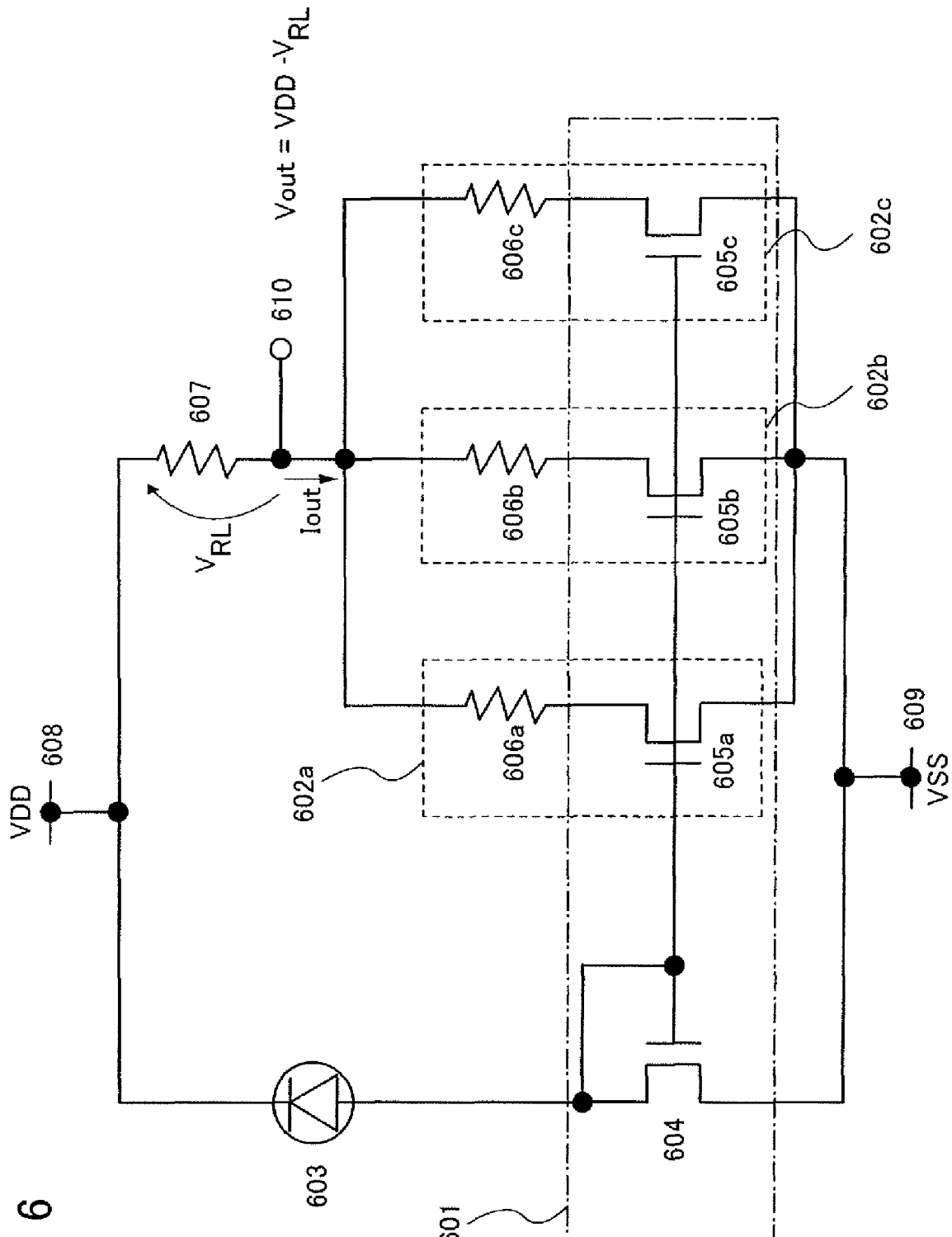
FIG. 6 is a diagram illustrating a circuit configuration of a photoelectric conversion device of the present invention.

A photoelectric conversion device shown in FIG. 6 includes a photoelectric conversion element 603, a current mirror circuit 601 which is an amplifier circuit for amplifying an output current (also referred to as a photocurrent) from the photoelectric conversion element 603, three internal resistors 606a to 606c, a load resistor 607, a high potential side power supply line 608, a low potential side power supply line 609, and an output terminal 610. The current mirror circuit 601 includes a reference side transistor 604 and three output side transistors 605a to 605c.

Note that the reference side transistor 604 and the output side transistors 605a to 605c are all n-channel field effect transistors in FIG. 6.

Note that a power supply potential on the high potential side is denoted as VDD and a power supply potential on the low potential side is denoted as VSS.

In FIG. 6, a first electrode and a gate electrode of the reference side transistor 604 are diode-connected to each other. The first electrode of the reference side transistor 604 is connected to an anode of the photoelectric conversion element 603, the gate electrode of the reference side transistor 604 is connected to each of gate electrodes of the three output side transistors 605a to 605c, and a second electrode of the reference side transistor 604 is connected to the low potential side power supply line 609.

A first electrode of the output side transistor 605a is connected to one terminal of the internal resistor 606a, and a second electrode of the output side transistor 605a is connected to the low potential side power supply line 609. The other terminal of the internal resistor 606a is connected to one terminal of the load resistor 607. In this specification, a circuit in which the output side transistor 605a and the internal resistor 606a are connected in series is referred to as an output generation circuit 602a.

In a similar manner, a first electrode of the output side transistor 605b is connected to one terminal of the internal resistor 606b, and a second electrode of the output side transistor 605b is connected to the low potential side power supply line 609. The other terminal of the internal resistor 606b is connected to one terminal of the load resistor 607. In this specification, a circuit in which the output side transistor 605b and the internal resistor 606b are connected in series is referred to as an output generation circuit 602b.

In a similar manner, a first electrode of the output side transistor 605c is connected to one terminal of the internal resistor 606c, and a second electrode of the output side transistor 605c is connected to the low potential side power supply line 609. The other terminal of the internal resistor 606c is connected to one terminal of the load resistor 607. In this specification, a circuit in which the output side transistor 605c and the internal resistor 606c are connected in series is referred to as an output generation circuit 602c.

One terminal of the load resistor 607 is connected to the output terminal 610. A cathode of the photoelectric conversion element 603 and the other terminal of the load resistor 607 are connected to the high potential side power supply line 608.

The circuit shown in FIG. 6 has a structure which is basically similar to that of the circuit shown in FIG. 1 and performs circuit operation basically similar to that of the circuit shown in FIG. 1. A difference between the circuits shown in FIG. 1 and FIG. 6 is an output voltage Vout. In the case of the circuit shown in FIG. 6, when a potential difference between the terminals of the load resistor 607 is $V_{RL}$, a voltage of Vout=VDD−$V_{RL}$ is output from the output terminal 610.

Figure 7A:
FIG. 7A is a diagram illustrating a sum of illuminance-current characteristics of output generation circuits and FIG. 7B is a diagram illustrating a sum of illuminance-voltage characteristics of the output generation circuits in the photoelectric conversion device of the present invention.
Figure 7B:
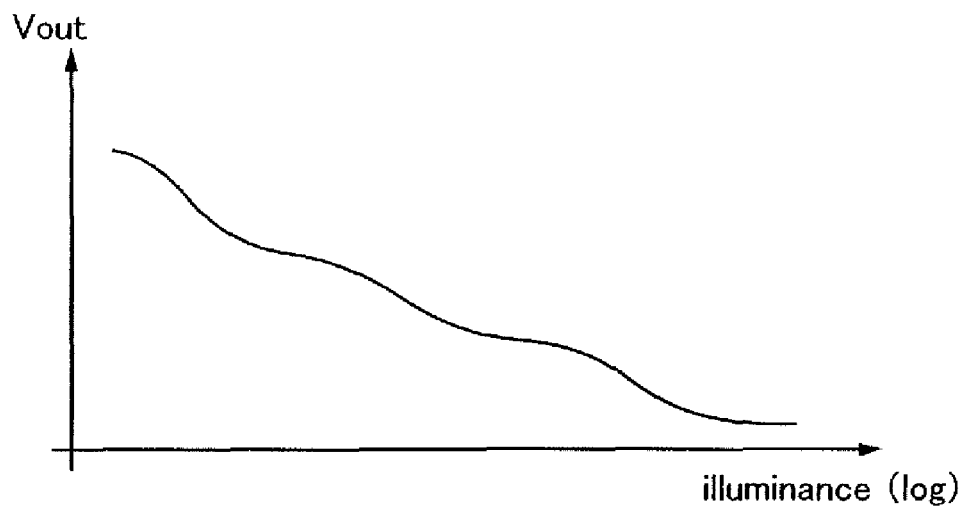

Here, FIGS. 7A and 7B show an illuminance characteristic of an output of the circuit shown in FIG. 6. FIG. 7A shows an illuminance characteristic of an output current Iout, and a vertical axis represents an output current (a linear scale) and a horizontal axis represents an illuminance (a logarithm scale). FIG. 7B shows an illuminance characteristic of an output voltage Vout, and a vertical axis represents an output voltage (a linear scale) and a horizontal axis represents an illuminance (a logarithm scale).

In the circuit shown in FIG. 1, as the illuminance increases, the output voltage Vout increases as shown in FIG. 5C. On the other hand, in the circuit shown in FIG. 6, as the illuminance increases, the output voltage Vout decreases. In either case, the output current Iout has a characteristic which is almost in proportion to the logarithm of the illuminance. In addition, the output voltage Vout also has a characteristic which is almost in proportion to the logarithm of the illuminance.

In this manner, in the photoelectric conversion device of this embodiment mode, the output which is almost in proportion to the logarithm of the illuminance can be obtained and an illuminance range which is applicable for the photoelectric conversion device can be widened.

Although three output generation circuits are connected in parallel in the circuit shown in FIG. 6, the number of the output generation circuits are not limited thereto as long as a plurality of the output generation circuits is provided. By increasing the number of the output generation circuits, the illuminance range which is applicable for the photoelectric conversion device can be widened and a change in the output with respect to the illuminance can be made small.

Since the photoelectric conversion device shown in this embodiment mode can be formed of only either n-channel transistors or p-channel transistors, the number of manufacturing steps of transistors and cost can be reduced. In addition, a variation in circuit characteristics caused by manufacturing process can be suppressed.

As the photoelectric conversion element described in this embodiment mode, an element such as a general photo diode which converts light energy into electric energy can be used.

Note that a variety of types of field effect transistors can be employed as n-channel transistors and p-channel transistors described in this embodiment mode. Thus, there are no limitations on types of transistors used. For example, a thin film transistor (a TFT) including a non-single crystal semiconductor film typified by amorphous silicon, polycrystalline silicon, microcrystalline (also referred to as semi-amorphous) silicon, or the like can be employed. In the case of using the TFT, there are various advantages. For example, since the TFT can be formed at temperature lower than that of the case of using single-crystal silicon, manufacturing cost can be reduced and a manufacturing apparatus can be made larger. Since the manufacturing apparatus can be large, the TFT can be formed over a large substrate. Therefore, a large number of photoelectric conversion devices can be formed at the same time so that manufacturing cost can be low. In addition, a substrate having low heat resistance can be used because the TFT can be manufactured at low temperature. Therefore, the transistor can be formed over a light-transmitting substrate. Accordingly, transmission of light in a photoelectric conversion element can be controlled by using the transistor formed over the light-transmitting substrate.

By using a catalyst (e.g., nickel) in the case of forming polycrystalline silicon, crystallinity can be further improved and a transistor having excellent electric characteristics can be formed. Accordingly, circuits which are operated at high speed can be formed over the same substrate. By using a catalyst (e.g., nickel) in the case of forming microcrystalline silicon, crystallinity can be further improved and a transistor having excellent electric characteristics can be formed. At this time, crystallinity can be improved by performing heat treatment without performing laser irradiation. In the case of not using a laser for crystallization, crystallinity unevenness of silicon can be suppressed. Therefore, a difference between characteristics of transistors can be suppressed. Note that polycrystalline silicon and microcrystalline silicon can be formed without using a catalyst (e.g., nickel).

In addition, a transistor can be formed by using a semiconductor substrate, an SOI substrate, or the like. Therefore, transistors with few variations in characteristics, sizes, shapes, or the like, with high current supply capacity, and in a small size can be formed. By using such transistors, power consumption of a circuit can be reduced or a circuit can be highly integrated.

Alternatively, a transistor including a compound semiconductor or an oxide semiconductor such as ZnO, a-InGaZnO, SiGe, GaAs, indium zinc oxide (IZO), indium tin oxide (ITO), or tin oxide (SnO), a thin film transistor obtained by thinning such a compound semiconductor or an oxide semiconductor, or the like can be used. Thus, manufacturing temperature can be lowered and for example, such a transistor can be formed at room temperature. Accordingly, the transistor can be formed directly on a substrate having low heat resistance such as a plastic substrate or a film substrate.

Alternatively, a transistor formed by using an inkjet method or a printing method, or the like can also be used. Accordingly, a transistor can be formed at room temperature, can be formed at a low vacuum, or can be formed over a large substrate. In addition, since the transistor can be formed without using a mask (a reticle), a layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

Alternatively, a transistor including an organic semiconductor or a carbon nanotube, or the like can be used. Accordingly, such a transistor can be formed using a substrate which can be bent. Therefore, a device using a transistor including an organic semiconductor or a carbon nanotube, or the like can resist a shock.

A variety of types of transistors can be used for a field effect transistor and the transistor can be formed over a variety of types of substrates. Accordingly, all of circuits which are necessary to realize a predetermined function may be formed over the same substrate. For example, all of the circuits which are necessary to realize the predetermined function may be formed over a glass substrate, a plastic substrate, a single-crystal substrate, an SOI substrate, or may be formed over various substrates. By forming a field effect transistor using a thin film transistor, the photoelectric conversion device of this embodiment mode can be formed over a light-transmitting substrate such as a glass substrate. Therefore, in the case where the photoelectric conversion element 103 or 603 is formed over a substrate, the photoelectric conversion element 103 or 603 can receive not only light from one surface of substrate but also light which transmits through the substrate from a back surface of the substrate, whereby efficiency of receiving light can be improved.

Note that this embodiment mode can be combined with technical components of other embodiment modes in this specification.

Embodiment Mode 2

Figure 21:
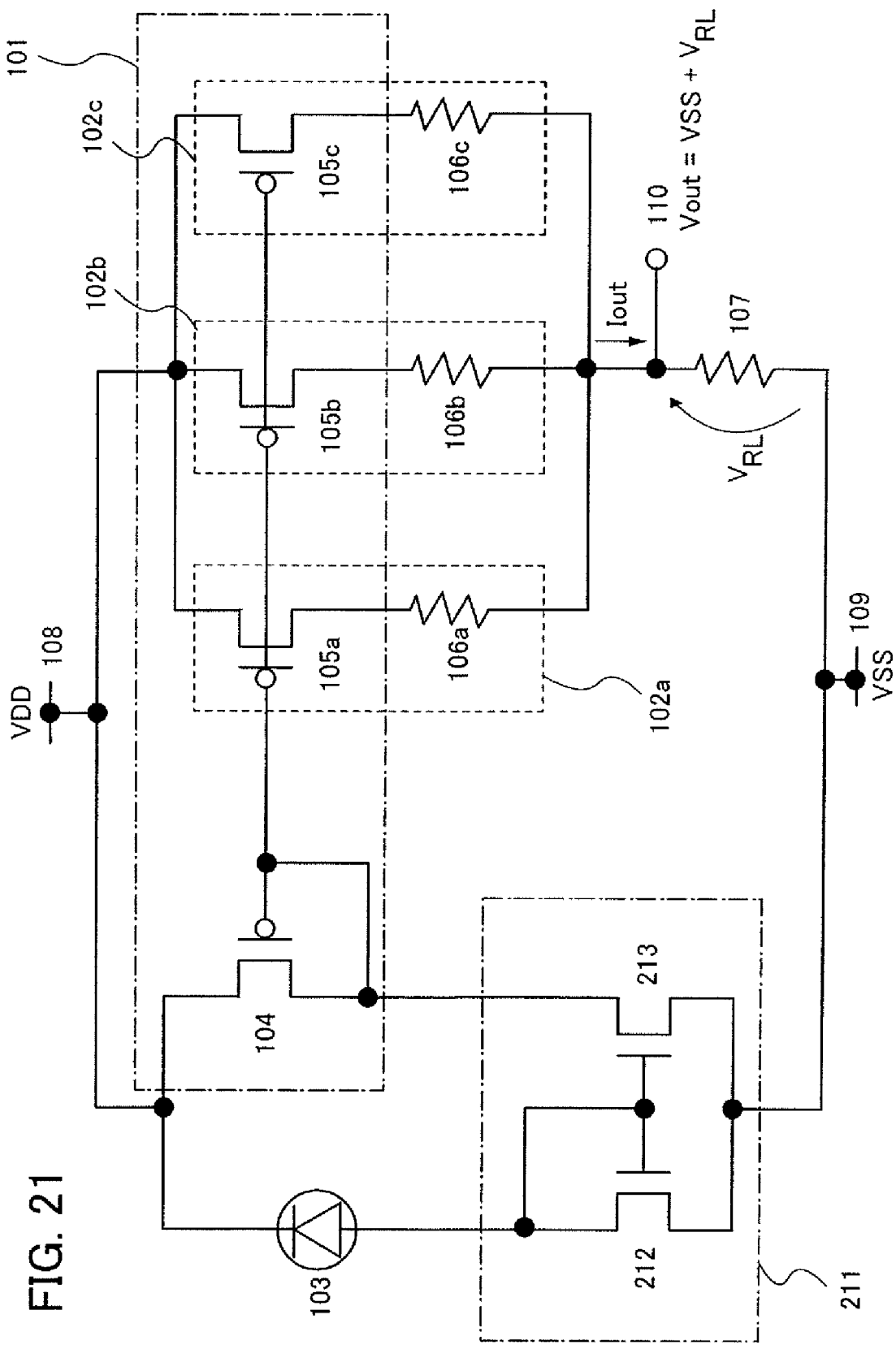
FIG. 21 is a diagram illustrating a circuit configuration of a photoelectric conversion device of the present invention.

This embodiment mode will be described with reference to drawings. FIG. 21 illustrates a circuit configuration of a photoelectric conversion device in Embodiment Mode 2 of the present invention.

The photoelectric conversion device in this embodiment mode includes a photoelectric conversion element 103, a first current mirror circuit 101 and a second current mirror circuit 211 which are amplifier circuits for amplifying an output current (also referred to as a photocurrent) from the photoelectric conversion element 103, three internal resistors 106a to 106c, a load resistor 107, a high potential side power supply line 108, a low potential side power supply line 109, and an output terminal 110. The first current mirror circuit 101 includes a first reference side transistor 104 and three first output side transistors 105a to 105c. The second current mirror circuit 211 includes a second reference side transistor 212 and a second output side transistor 213.

In FIG. 21, all the first reference side transistor 104 and the first output side transistors 105a to 105c are p-channel field effect transistors. The second reference side transistor 212 and the second output side transistor 213 are both n-channel field effect transistors.

Note that in this specification, a power supply potential on the high potential side is denoted as VDD, and a power supply potential on the low potential side is denoted as VSS.

In FIG. 21, a first electrode and a gate electrode of the second reference side transistor 212 are diode-connected to each other. The first electrode of the second reference side transistor 212 is connected to an anode of the photoelectric conversion element 103, the gate electrode of the second reference side transistor 212 is connected to a gate electrode of the second output side transistor 213, and a second electrode of the second reference side transistor 212 is connected to the low potential side power supply line 109.

A first electrode of the second output side transistor 213 is connected to a first electrode of the first reference side transistor 104, and a second electrode of the second output side transistor 213 is connected to the low potential side power supply line 109.

A first electrode and a gate electrode of the first reference side transistor 104 are diode-connected to each other. The gate electrode of the first reference side transistor 104 is connected to each of gate electrodes of the three first output side transistors 105a to 105c, and a second electrode of the first reference side transistor 104 is connected to a cathode of the photoelectric conversion element 103 and the high potential side power supply line 108.

A first electrode of the first output side transistor 105a is connected to one terminal of the internal resistor 106a, and a second electrode of the first output side transistor 105a is connected to the high potential side power supply line 108. The other terminal of the internal resistor 106a is connected to one terminal of the load resistor 107. In this specification, a circuit in which the first output side transistor 105a and the internal resistor 106a are connected in series is referred to as an output generation circuit 102a.

In a similar manner, a first electrode of the first output side transistor 105b is connected to one terminal of the internal resistor 106b, and a second electrode of the first output side transistor 105b is connected to the high potential side power supply line 108. The other terminal of the internal resistor 106b is connected to one terminal of the load resistor 107. In this specification, a circuit in which the first output side transistor 105b and the internal resistor 106b are connected in series is referred to as an output generation circuit 102b.

In a similar manner, a first electrode of the first output side transistor 105c is connected to one terminal of the internal resistor 106c, and a second electrode of the first output side transistor 105c is connected to the high potential side power supply line 108. The other terminal of the internal resistor 106c is connected to one terminal of the load resistor 107. In this specification, a circuit in which the first output side transistor 105c and the internal resistor 106c are connected in series is referred to as an output generation circuit 102c.

One terminal of the load resistor 107 is connected to the output terminal 110 and the other terminal of the load resistor 107 is connected to the low potential side power supply line 109.

Next, operation of the photoelectric conversion device of this embodiment mode will be described.

The photoelectric conversion element 103 outputs a photocurrent corresponding to the illuminance of light which is incident on the photoelectric conversion element 103. As the illuminance increases, the amount of photocurrent output from the photoelectric conversion element 103 increases. The photocurrent output from the photoelectric conversion element 103 flows through the second reference side transistor 212, whereby a potential difference is made between a gate and a source of the second reference side transistor 212. The potential difference is also applied between a gate and a source of the second output side transistor 213. In the second current mirror circuit 211, by applying the same voltage to the gate electrodes of the second reference side transistor 212 and the second output side transistor 213, a current which flows through the second output side transistor 213 is controlled with the photocurrent which has flowed through the second reference transistor 212 as a reference.

As described above, a current based on a photocurrent flows through the second output side transistor 213. The current also flows through the first reference side transistor 104. Thus, also in the first current mirror circuit 101, like as the second current mirror circuit 211, the same voltage is applied to the gate electrodes of the first reference side transistor 104 and the three first output side transistors 105a to 105c. Then, a current which flows through each of the first output side transistors 105a to 105c is controlled with the photocurrent which has flowed through the first reference side transistor 104 as a reference.

As a result, the current in accordance with the photocurrent flows through the first output side transistors 105a to 105c, whereby output currents are generated in the three output generation circuits 102a to 102c. Operation of the output generation circuits 102a to 102c will be described later. The sum of the output currents generated by the three output generation circuits 102a to 102c flows through the load resistor 107. Thus, a potential difference is made between the terminals of the load resistor 107. When the potential difference is $V_{RL}$ and an output voltage is Vout, a voltage of Vout=$V_{RL}$+VSS is output from the output terminal 110.

Here, in the second current mirror circuit 211, if the characteristics of the second reference side transistor 212 and the second output side transistor 213 are the same, a current which has the same amount as that of a photocurrent can flow through the first reference side transistor 104 in the first current mirror circuit 101. In addition, by setting ratios of a channel length L to a channel width W, α=W/L, of the second reference side transistor 212 and the second output side transistor 213 different from each other, the photocurrent can be amplified. For example, in order to change the value of α of the second output side transistor 213, the channel length L and the channel width W of the second output side transistor 213 may be changed or the number of the second output side transistor 213 can be increased and the second output side transistors 213 can be connected in parallel.

Next, the operation of the output generation circuits 102a to 102c will be described with reference to FIGS. 2 to 4.

FIG. 2 is a diagram illustrating a structure of the output generation circuit 102a. The first output side transistor 105a and the internal resistor 106a are connected in series. A gate voltage which is generated in accordance with the photocurrent is applied to a gate electrode of the first output side transistor 105a. The gate voltage is denoted as Vgate. In addition, a potential of a second electrode of the internal resistor 106a is the output potential Vout.

FIG. 3 shows voltage-current characteristics of the first output side transistor 105a and the internal resistor 106a, in which a current which flows through the output generation circuit 102a is I and a potential of a connection portion between the first output side transistor 105a and the internal resistor 106a is V. In FIG. 3, a vertical axis represents a current and a horizontal axis represents a voltage. In FIG. 3, a curve 301 represents a voltage-current characteristic of the first output side transistor 105a in the case where light with an illuminance $L_1$ (a unit: lux) is delivered to the photoelectric conversion element. A curve 302 represents a voltage-current characteristic of the first output side transistor 105a in the case where light with an illuminance of $L_2$ ($L_1 < L_2$) is delivered to the photoelectric conversion element. In addition, a straight line 303 represents a voltage-current characteristic of the internal resistor 106a. The output generation circuit 102a operates with the voltage V and the current I which correspond to an intersection (this is referred to as an operation point) of the curve showing the voltage-current characteristic of the first output side transistor 105a and the straight line showing the voltage-current characteristic of the internal resistor 106a.

When the light with the illuminance $L_1$ enters, the first output side transistor 105a has the voltage-current characteristic shown by the curve 301 and an operation point of the output generation circuit 102a is a point 304 which is an intersection of the curve 301 and the straight line 303. Then, a current $I_1$ flows through the output generation circuit 102a.

At that time, the first output side transistor 105a operates in a saturation range. The saturation range is a range in which a magnitude relation of a voltage VGS between a gate and the source, a voltage VDS between a drain and the source, and a threshold voltage VTH of the first output side transistor 105a is |VGS−VTH|<|VDS|. In this range, a current which depends only on the voltage VGS between the gate and the source of the first output side transistor 105a flows through the first output side transistor 105a. Therefore, a current which is in proportion to the illuminance flows through the output generation circuit 102a.

In the case where light with the illuminance which is higher than the illuminance $L_1$ enters, a current which is in proportion to the illuminance flows through the output generation circuit 102a when the illuminance is within a range in which the first output side transistor 105a operates in the saturation range.

In the case where the illuminance is further increased and light with the illuminance $L_2$ enters, the first output side transistor 105a has the voltage-current characteristic shown by the curve 302. At that time, an operation point of the output generation circuit 102a is a point 305 and a current $I_2$ flows through the output generation circuit 102a.

At that time, the first output side transistor 105a operates in a linear range. The linear range is a range in which a magnitude relation of the voltage VGS between the gate and the source, the voltage VDS between the drain and the source, and the threshold voltage VTH of the first output side transistor 105a is |VGS−VTH|>|VDS|. In this range, a current which depends on the voltage VGS between the gate and the source and the voltage VDS between the drain and the source of the first output side transistor 105a flows through the first output side transistor 105a. Therefore, the current which flows through the output generation circuit 102a is not in proportion to the illuminance and gradually becomes closer to Imax. Note that Imax is represented by (VDD−Vout)/Ri. It is to be noted that Ri is a resistance value of the internal resistor 106.

Here, an illuminance-current characteristic of the output generation circuit 102a is shown in FIG. 4. In FIG. 4, a horizontal axis represents an illuminance and a vertical axis represents the current which flows through the output generation circuit 102a. Both of them are represented in a logarithm scale.

As described above, a current which is in proportion to the illuminance flows through the output generation circuit 102a when the illuminance is within a range in which the first output side transistor 105a operates in the saturation range (for example, the illuminance $L_1$). On the other hand, when the illuminance is within a range in which the first output side transistor 105a operates in the linear range (for example, the illuminance $L_2$), the current which flows through the output generation circuit 102a is not in proportion to the illuminance and gradually becomes closer to Imax.

Although the output generation circuit 102a has been described so far, the output generation circuit 102b and the output generation circuit 102c also operate in a similar manner.

Next, the operation of the photoelectric conversion device of this embodiment mode will be described again. In the photoelectric conversion device of this embodiment mode, a plurality of output generation circuits which perform the operation described above is connected in parallel. Here, operation of the circuits in the case where the three output generation circuits 102a to 102c are connected in parallel as shown in FIG. 21 will be described.

In the three output generation circuits 102a to 102c, ratios of a channel length L to a channel width W, α=W/L, of the first output side transistors 105a to 105c are made different from each other. For example, α of the first output side transistor 105a is $\alpha_1$, α of the first output side transistor 105b is $\alpha_2$, and the α of the first output side transistor 105c is $\alpha_3$. A magnitude relation thereof is $\alpha_1 > \alpha_2 > \alpha_3$. Preferably, α is set as follows: $\alpha_1/\alpha_2$=approximately 10 and $\alpha_2/\alpha_3$=approximately 10.

Note that resistance values of the internal resistors 106a to 106c are set to be the same for convenience of explanation. However, the resistance values of the internal resistors 106a to 106c are not limited thereto and may be different from each other.

Operation of the circuit shown in FIG. 21 in that case is illustrated in FIGS. 5A to 5C. FIG. 5A shows illuminance-current characteristics of the output generation circuits 102a to 102c. In FIG. 5A, a horizontal axis represents an illuminance and a vertical axis represents currents which flow through the respective output generation circuits 102a to 102c. Both of them are represented in a logarithm scale.

Note that a curve 501a represents the illuminance-current characteristic of the first output generation circuit 102a, a curve 501b represents the illuminance-current characteristic of the second output generation circuit 102b, and a curve 501c represents the illuminance-current characteristic of the third output generation circuit 102c.

In the output generation circuits 102a to 102c, as α of the first output side transistors 105a to 105c becomes larger, the first output side transistors 105a to 105c can be driven in the linear range with the lower illuminance because each of the output side transistors 105a to 105c is connected to one of the internal resistors 106a to 106c in series. Therefore, as α of the first output side transistors 105a to 105c becomes larger, the current which flows through the output generation circuits 102a to 102c hits a peak with the further lower illuminance.

The sum of the currents which flow through the output generation circuits 102a to 102c is an output current (the output current is denoted as Iout) of the photoelectric conversion device of this embodiment mode. Then, the output current flows through the load resistor 107 and a sum of a potential difference generated in the load resistor 107 and VSS is output as the output voltage Vout.

The sum (the output current) of the currents which flow through the output generation circuits 102a to 102c is shown in FIG. 5B. In addition, the output voltage Vout is shown in FIG. 5C. In FIGS. 5B and 5C, a horizontal axis represents an illuminance which is shown in a logarithm scale, and a vertical axis represents an output current or the output voltage which is shown in a linear scale.

Since the output current Iout is the sum of the currents which flow through the output generation circuit 102a to 102c, the output current Iout has a characteristic which is in proportion to a logarithm of the illuminance as shown in FIG. 5B. In addition, the output voltage Vout also has a characteristic which is almost in proportion to the logarithm of the illuminance.

In this manner, in the photoelectric conversion device of this embodiment mode, an output which is almost in proportion to a logarithm of illuminance can be obtained and an illuminance range applicable for the photoelectric conversion device can be widened.

Further, when the second current mirror circuit 211 is provided, a current obtained by amplifying the photocurrent can be input to the first current mirror circuit 101. This can shorten time required for making gate voltage of the first reference side transistor 104 and the first output side transistors 105a to 105c a predetermined voltage. Accordingly, in the case where an illuminance is changed, time which is necessary for an output to reach a predetermined value can be shortened, whereby a photoelectric conversion device whose output has a high response speed even if the illuminance is changed can be obtained.

Although three output generation circuits are connected in parallel in the circuit shown in FIG. 21, the number of the output generation circuits are not limited thereto as long as a plurality of the output generation circuits is provided. By increasing the number of the output generation circuits, the illuminance range which is applicable for the photoelectric conversion device can be widened and a change in the output with respect to the illuminance can be made small.

Note that the load resistor 107 may be incorporated in the photoelectric conversion device or an external resistor such as a chip resistor can be attached as the load resistor 107. When the load resistor 107 is incorporated in the photoelectric conversion device, the external resistor is not necessary, whereby the number of steps and parts for connecting the external resistor can be reduced. In addition, since an area for the external resistor is unnecessary, an area of a photoelectric conversion portion of an electronic device or the like can be made small. On the other hand, when the load resistor 107 is an external resistor, influence of a variation in a load resistance (especially a variation in resistance with respect to temperature) can be suppressed.

Note that in the circuit shown in FIG. 21, although the second reference side transistor 212 and the second output side transistor 213 are n-channel transistors, and the first reference side transistor 104 and the first output side transistors 105a to 105c are p-channel transistors, the reverse case may be employed. A circuit configuration in the reverse case is shown in FIG. 22.

Figure 22:
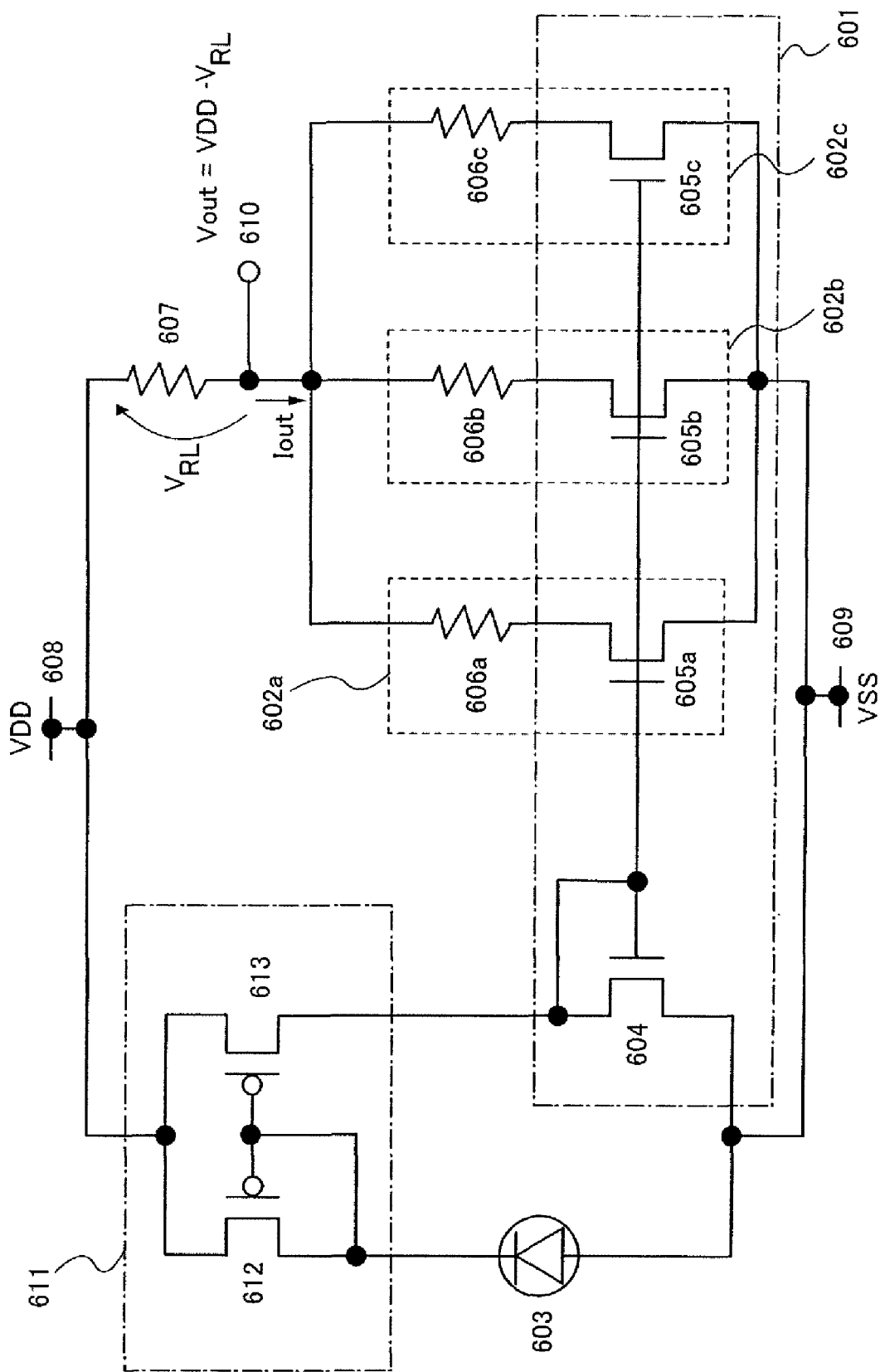
FIG. 22 is a diagram illustrating a circuit configuration of a photoelectric conversion device of the present invention.

A photoelectric conversion device shown in FIG. 22 includes a photoelectric conversion element 603, a first current mirror circuit 601 and a second current mirror circuit 611 which are amplifier circuits for amplifying an output current (also referred to as a photocurrent) from the photoelectric conversion element 603, three internal resistors 606a to 606c, a load resistor 607, a high potential side power supply line 608, a low potential side power supply line 609, and an output terminal 610. The first current mirror circuit 601 includes a first reference side transistor 604 and three first output side transistors 605a to 605c. The second current mirror circuit 611 includes a second reference side transistor 612 and a second output side transistor 613.

In FIG. 22, all the first reference side transistor 604 and the first output side transistors 605a to 605c are n-channel field effect transistors. The second reference side transistor 612 and the second output side transistor 613 are both p-channel field effect transistors.

Note that a power supply potential on the high potential side is denoted as VDD, and a power supply potential on the low potential side is denoted as VSS.

In FIG. 22, a first electrode and a gate electrode of the second reference side transistor 612 are diode-connected to each other. The first electrode of the second reference side transistor 612 is connected to a cathode of the photoelectric conversion element 603, the gate electrode of the second reference side transistor 612 is connected to a gate electrode of the second output side transistor 613, and a second electrode of the second reference side transistor 612 is connected to the high potential side power supply line 608.

A first electrode of the second output side transistor 613 is connected to a first electrode of the first reference side transistor 604, and a second electrode of the second output side transistor 613 is connected to the high potential side power supply line 608.

A first electrode and a gate electrode of the first reference side transistor 604 are diode-connected to each other. The gate electrode of the first reference side transistor 604 is connected to each of gate electrodes of the three first output side transistors 605a to 605c, and a second electrode of the first reference side transistor 604 is connected to an anode of the photoelectric conversion element 603 and the low potential side power supply line 609.

A first electrode of the first output side transistor 605a is connected to one terminal of the internal resistor 606a, and a second electrode of the first output side transistor 605a is connected to the low potential side power supply line 609. The other terminal of the internal resistor 606a is connected to one terminal of the load resistor 607. In this specification, a circuit in which the first output side transistor 605a and the internal resistor 606a are connected in series is referred to as an output generation circuit 602a.

In a similar manner, a first electrode of the first output side transistor 605b is connected to one terminal of the internal resistor 606b, and a second electrode of the first output side transistor 605b is connected to the low potential side power supply line 609. The other terminal of the internal resistor 606b is connected to one terminal of the load resistor 607. In this specification, a circuit in which the first output side transistor 605b and the internal resistor 606b are connected in series is referred to as an output generation circuit 602b.

In a similar manner, a first electrode of the first output side transistor 605c is connected to one terminal of the internal resistor 606c, and a second electrode of the first output side transistor 605c is connected to the low potential side power supply line 609. The other terminal of the internal resistor 606c is connected to one terminal of the load resistor 607. In this specification, a circuit in which the first output side transistor 605c and the internal resistor 606c are connected in series is referred to as an output generation circuit 602c.

One terminal of the load resistor 607 is connected to the output terminal 610 and the other terminal of the load resistor 607 is connected to the high potential side power supply line 608.

The circuit shown in FIG. 22 has a structure which is basically similar to that of the circuit shown in FIG. 21 and performs circuit operation basically similar to that of the circuit shown in FIG. 21. A difference between the circuits shown in FIG. 21 and FIG. 22 is an output voltage Vout. In the case of the circuit shown in FIG. 22, when a potential difference between the terminals of the load resistor 607 is $V_{RL}$, a voltage of Vout=VDD−$V_{RL}$ is output from the output terminal 610.

Here, FIGS. 7A and 7B show an illuminance characteristic of an output of the circuit shown in FIG. 22. FIG. 7A shows an illuminance characteristic of an output current Iout, and a vertical axis represents an output current (a linear scale) and a horizontal axis represents an illuminance (a logarithm scale). FIG. 7B shows an illuminance characteristic of an output voltage Vout, and a vertical axis represents an output voltage (a linear scale) and a horizontal axis represents an illuminance (a logarithm scale).

In the circuit shown in FIG. 21, as the illuminance increases, the output voltage Vout increases as shown in FIG. 5C. On the other hand, in the circuit shown in FIG. 22, as the illuminance increases, the output voltage Vout decreases. In either case, the output current Iout has a characteristic which is almost in proportion to the logarithm of the illuminance. In addition, the output voltage Vout also has a characteristic which is almost in proportion to the logarithm of the illuminance.

In this manner, in the photoelectric conversion device of this embodiment mode, the output which is almost in proportion to the logarithm of the illuminance can be obtained and an illuminance range which is applicable for the photoelectric conversion device can be widened.

Although three output generation circuits are connected in parallel in the circuit shown in FIG. 22, the number of the output generation circuits are not limited thereto as long as a plurality of the output generation circuits is provided. By increasing the number of the output generation circuits, the illuminance range which is applicable for the photoelectric conversion device can be widened and a change in the output with respect to the illuminance can be made small.

Note that since the photoelectric conversion device in this embodiment mode includes both n-channel transistors and p-channel transistors, a variation in circuit characteristics due to a variation in characteristics of transistors can be suppressed.

As the photoelectric conversion element described in this embodiment mode, an element such as a general photo diode which converts light energy into electric energy can be used.

Note that a variety of modes of field effect transistors can be employed as n-channel transistors and p-channel transistors described in this embodiment mode. Thus, there are no limitations on types of transistors employed. For example, a thin film transistor (a TFT) including a non-single crystal semiconductor film typified by amorphous silicon, polycrystalline silicon, microcrystalline (also referred to as semi-amorphous) silicon, or the like can be employed. In the case of using the TFT, there are various advantages. For example, since the TFT can be formed at temperature lower than that of the case of using single-crystal silicon, manufacturing cost can be reduced or a manufacturing apparatus can be made larger. Since the manufacturing apparatus can be large, the TFT can be formed over a large substrate. Therefore, a large number of photoelectric conversion devices can be formed at the same time so that manufacturing cost can be low. In addition, a substrate having low heat resistance can be used because the TFT can be manufactured at low temperature. Therefore, the transistor can be formed over a light-transmitting substrate. Accordingly, transmission of light in a photoelectric conversion element can be controlled by using the transistor formed over the light-transmitting substrate.

By using a catalyst (e.g., nickel) in the case of forming polycrystalline silicon, crystallinity can be further improved and a transistor having excellent electric characteristics can be formed. Accordingly, circuits which are operated at high speed can be formed over the same substrate. By using a catalyst (e.g., nickel) in the case of forming microcrystalline silicon, crystallinity can be further improved and a transistor having excellent electric characteristics can be formed. At this time, crystallinity can be improved by performing heat treatment without performing laser irradiation. In the case of not using a laser for crystallization, crystallinity unevenness of silicon can be suppressed. Therefore, a difference between characteristics of transistors can be suppressed. Note that polycrystalline silicon and microcrystalline silicon can be formed without using a catalyst (e.g., nickel).

In addition, a transistor can be formed by using a semiconductor substrate, an SOI substrate, or the like. Therefore, transistors with few variations in characteristics, sizes, shapes, or the like, with high current supply capacity, and in a small size can be formed. By using such transistors, power consumption of a circuit can be reduced or a circuit can be highly integrated.

Alternatively, a transistor including a compound semiconductor or an oxide semiconductor such as ZnO, a-InGaZnO, SiGe, GaAs, indium zinc oxide (IZO), indium tin oxide (ITO), or tin oxide (SnO), a thin film transistor obtained by thinning such a compound semiconductor or an oxide semiconductor, or the like can be used. Thus, manufacturing temperature can be lowered and for example, such a transistor can be formed at room temperature. Accordingly, the transistor can be formed directly on a substrate having low heat resistance such as a plastic substrate or a film substrate.

Alternatively, a transistor formed by using an inkjet method or a printing method, or the like can also be used. Accordingly, a transistor can be formed at room temperature, can be formed at a low vacuum, or can be formed over a large substrate. In addition, since the transistor can be formed without using a mask (a reticle), a layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

Alternatively, a transistor including an organic semiconductor or a carbon nanotube, or the like can be used. Accordingly, such a transistor can be formed using a substrate which can be bent. Therefore, a device using a transistor including an organic semiconductor or a carbon nanotube, or the like can resist a shock.

A variety of types of transistors can be used for a field effect transistor and the transistor can be formed over various types of substrates. Accordingly, all of circuits which are necessary to realize a predetermined function may be formed over the same substrate. For example, all of the circuits which are necessary to realize the predetermined function may be formed using a glass substrate, a plastic substrate, a single-crystal substrate, an SOI substrate, or may be formed over various substrates. By forming a field effect transistor using a thin film transistor, the photoelectric conversion device of this embodiment mode can be formed over a light-transmitting substrate such as a glass substrate. Therefore, in the case where the photoelectric conversion element 103 or 603 is formed over a substrate, the photoelectric conversion element 103 or 603 can receive not only light from one surface of the substrate but also light which transmits through the substrate from a back surface of the substrate, whereby efficiency of receiving light can be improved.

Note that this embodiment mode can be combined with technical components of other embodiment modes in this specification.

Embodiment Mode 3

This embodiment mode will show a manufacturing method of the photoelectric conversion device described in the above embodiment modes as an example using cross sectional views with reference to FIGS. 8A to 8D, and FIGS. 9A to 9C.

First, a photoelectric conversion element and a field effect transistor are formed over a substrate (a first substrate 310). In this embodiment mode, an AN 100 which is one of glass substrates is used for the substrate 310. In forming the field effect transistor over the substrate by using a thin film transistor, the photoelectric conversion element and the thin film transistor can be manufactured in a continuous process, and therefore, the photoelectric conversion device can be produced in large quantities, which is an advantage.

A silicon oxide film including nitrogen (with a film thickness of 100 nm), which serves as a base insulating film 312, is formed by plasma CVD, and a semiconductor film such as an amorphous silicon film including hydrogen (with a film thickness of 54 nm) is stacked without being exposed to atmosphere. Further, the base insulating film 312 may be formed by stacking a silicon oxide film, a silicon nitride film, and a silicon oxide film including nitrogen. For example, a film in which a silicon nitride film including oxygen with a film thickness of 50 nm and a silicon oxide film including nitrogen with a film thickness of 100 nm are stacked may be formed as the base insulating film 312. Note that each of the silicon oxide film including nitrogen and the silicon nitride film serves as a blocking layer which prevents an impurity such as alkali metal from diffusing from the glass substrate.

Subsequently, the amorphous silicon film is crystallized by a known technique (a solid-phase epitaxy method, a laser crystallization method, a crystallization method using catalytic metal, or the like) to form a semiconductor film having a crystalline structure (a crystalline semiconductor film), e.g., a polycrystalline silicon film. Here, a polycrystalline silicon film is obtained by a crystallization method using a catalytic element. First, a nickel acetate solution including 10 ppm by weight of nickel is added by a spinner. Note that a nickel element may be dispersed over an entire surface by sputtering instead of adding a solution. Next, heat treatment for crystallizing the amorphous silicon film is performed to form a semiconductor film (here, a polycrystalline silicon film) having a crystalline structure. Here, a polycrystalline silicon film is obtained by performing heat treatment for crystallizing (at 550° C. for 4 hours) after heat treatment (at 500° C. for one hour) is performed.

Subsequently, an oxide film over the surface of the polycrystalline silicon film is removed by a dilute hydrofluoric acid or the like. After that, irradiation with laser light (XeCl which has a wavelength of 308 nm) for increasing the degree of crystallinity and repairing defects left in crystal grains is performed in the atmosphere or an oxygen atmosphere.

As the laser light, excimer laser light with a wavelength of 400 nm or less, or a second harmonic or a third harmonic of a YAG laser is used. Here, pulsed laser light with a repetition rate of approximately 10 to 1000 Hz is used, the pulsed laser light is condensed to 100 to 500 mJ/cm$^2$ by an optical system, and irradiation is performed with an overlap rate of 90 to 95% to scan a surface of the silicon film. In this embodiment mode, irradiation with laser light having a repetition rate of 30 Hz and energy density of 470 mJ/cm$^2$ is performed in the atmosphere.

Note that since laser light irradiation is performed in the atmosphere or in an oxygen atmosphere, an oxide film is formed on the surface. Although an example in which the pulsed laser is used is shown in this embodiment mode, a continuous wave laser may be used. In order to obtain crystals with a large grain size at the time of crystallization of a semiconductor film, it is preferable to use a solid laser which is capable of continuous oscillation and to apply the second to fourth harmonic of a fundamental wave. Typically, a second harmonic (532 nm) or a third harmonic (355 nm) of an Nd:YVO$_4$ laser (a fundamental wave of 1064 nm) is applied.

In the case of using a continuous wave laser, laser light which is emitted from a continuous wave YVO$_4$ laser with a 10 W output is converted into a harmonic by a non-linear optical element. In addition, there is a method in which a YVO$_4$ crystal and a non-linear optical element are put in an oscillator and a high harmonic is emitted. Then, laser light having a rectangular shape or an elliptical shape on an irradiated surface is preferably formed by an optical system and emitted to an object to be processed. At this time, an energy density of approximately 0.01 to 100 MW/cm$^2$ (preferably, 0.1 to 10 MW/cm$^2$) is necessary. Irradiation to the semiconductor film may be performed by moving the semiconductor film at a rate of approximately 10 to 2000 cm/s relatively to the laser light.

Subsequently, in addition to the oxide film which is formed by the above-described laser light irradiation, a barrier layer formed using an oxide film having a thickness of 1 to 5 nm in total is formed by treatment of the surface with ozone water for 120 seconds. The barrier layer is formed in order to remove the catalytic element which is added for crystallizing the amorphous silicon film, e.g., nickel (Ni) from the film. Although the barrier layer is formed using ozone water here, the barrier layer may be formed by depositing an oxide film having a thickness of approximately 1 to 10 nm by a method of oxidizing a surface of the semiconductor film having a crystalline structure by UV-ray irradiation in an oxygen atmosphere; a method of oxidizing a surface of the semiconductor film having a crystalline structure by oxygen plasma treatment, plasma CVD, sputtering, an evaporation method, or the like. Alternatively, the oxide film formed by the laser light irradiation may be removed before forming the barrier layer.

Then, an amorphous silicon film including an argon element which serves as a gettering site is formed with a thickness of 10 to 400 nm, here 100 nm, over the barrier layer by sputtering. The amorphous silicon film including an argon element is formed under an atmosphere including argon using a silicon target. In the case where the amorphous silicon film including an argon element is formed by plasma CVD, deposition conditions are as follows: a flow ratio of monosilane to argon (SiH$_4$:Ar) is 1:99, deposition pressure is 6.665 Pa, RF power density is 0.087 W/cm$^2$, and deposition temperature is 350° C.

After that, the substrate over which the amorphous silicon film including an argon element is formed is placed in a furnace heated at 650° C., and heat treatment is performed for three minutes to remove the catalytic element (gettering).

Thus, the catalytic element concentration in the semiconductor film having a crystalline structure is reduced. A lamp annealing apparatus may be used instead of the furnace.

Subsequently, after the amorphous silicon film including an argon element, which is a gettering site, is selectively removed using the barrier layer as an etching stopper, the barrier layer is selectively removed with a diluted hydrofluoric acid. Note that since nickel has a tendency to move to a region having high oxygen concentration at the time of gettering, it is preferable that the barrier layer formed using an oxide film be removed after gettering.

In the case where crystallization of a semiconductor film is performed without using a catalytic element, the above-described steps such as forming the barrier layer, forming the gettering site, heat treatment for gettering, removing the gettering site, and removing the barrier layer are not necessary.

Figure 8A:
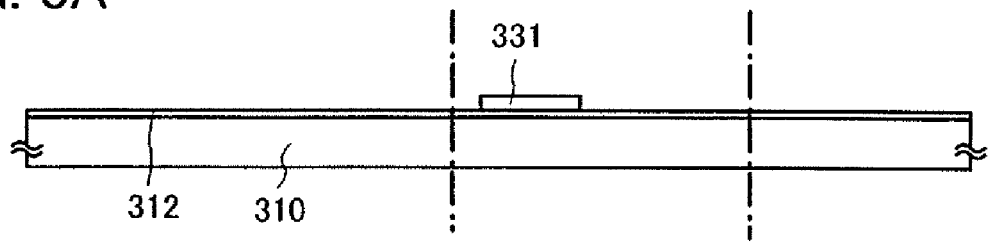
FIGS. 8A to 8D are diagrams illustrating a manufacturing method of a photoelectric conversion circuit of the present invention.

Subsequently, after a thin oxide film is formed on the surface of the obtained semiconductor film having a crystalline structure (e.g., a crystalline silicon film) using ozone water, a mask formed from a resist is formed using a first photomask and etching is performed to process the semiconductor film into a desired shape, and a semiconductor film which is separated into an island shape (in this specification, referred to as island-shaped semiconductor region 331) is formed (see FIG. 8A). After the island-shaped semiconductor region is formed, the mask formed from the resist is removed.

Subsequently, the island-shaped semiconductor region is doped with a slight amount of an impurity element (e.g., boron or phosphorus) to control the threshold voltage of the thin film transistors if necessary. Here, an ion doping method in which diborane ($B_2H_6$) is not mass-separated but excited by plasma is used.

Subsequently, the oxide film is removed with an etchant including a hydrofluoric acid, and at the same time, a surface of the island-shaped semiconductor region 331 is washed. After that, an insulating film including silicon as a main component, which serves as a gate insulating film 313, is formed. Here, a silicon oxide film including nitrogen (composition ratio of Si=32%, O=59%, N=7%, and H=2%) is formed with a thickness of 115 nm by plasma CVD.

Figure 8B:
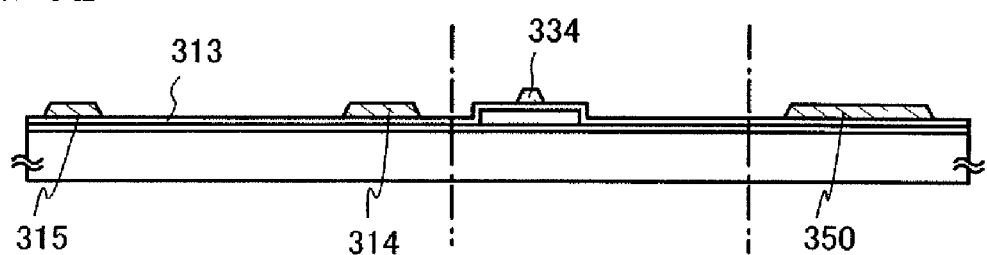

Subsequently, after a metal film is formed over the gate insulating film 313, a gate electrode 334, wirings 314 and 315, and a terminal electrode 350 are formed using a second photomask (see FIG. 8B). A stacked-layer film of tantalum nitride with a thickness of 30 nm and tungsten (W) with a thickness of 370 nm is used for the metal film, for example.

As the gate electrode 334, the wirings 314 and 315, and the terminal electrode 350, a single-layer film formed from an element of titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), or an alloy material or a compound material including the above-described element as a main component; a single-layer film formed from nitride thereof, e.g., titanium nitride, tungsten nitride, tantalum nitride or molybdenum nitride may be used as well as the above-described film.

Figure 8C:
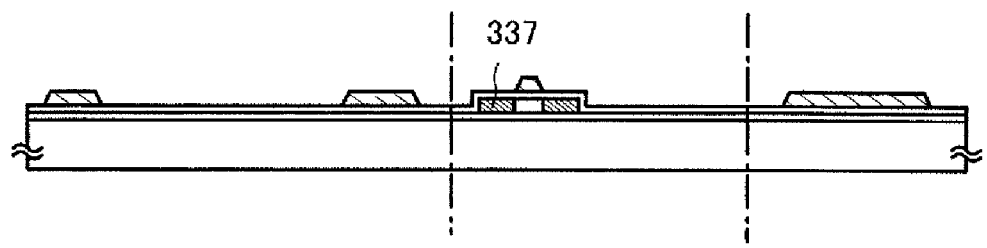

Subsequently, an impurity which imparts one conductivity type is introduced into the island-shaped semiconductor region 331 to form a source region and drain region 337 of the TFT 113 (see FIG. 8C). In this embodiment mode, an n-channel TFT is formed, and an n-type impurity, e.g., phosphorus (P) or arsenic (As) is introduced into the island-shaped semiconductor region 331.

Next, after a first interlayer insulating film (not shown) including a silicon oxide film is formed with a thickness of 50 nm by CVD, a process is performed in which the impurity element added to each of the island-shaped semiconductor regions are activated. This activation process is performed by a rapid thermal annealing method (an RTA method) using a lamp light source, a method of irradiating from a back side of a substrate with a YAG laser or an excimer laser, heat treatment using a furnace, or a method in which any of the above-described methods are combined.

Subsequently, a second interlayer insulating film 316 which is a silicon nitride film including hydrogen and oxygen is formed with a film thickness of, for example, 10 nm.

Figure 8D:
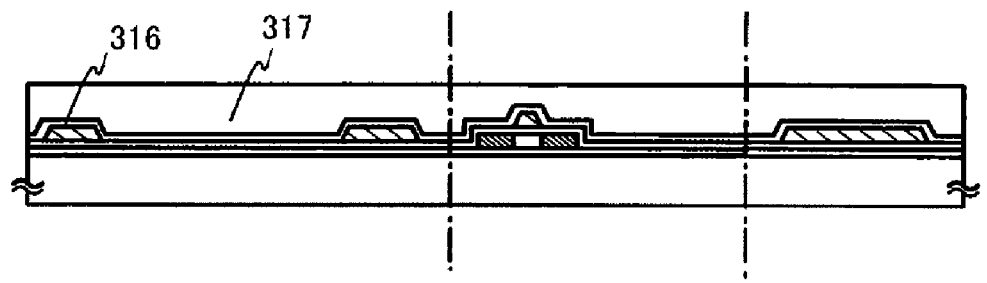

Subsequently, a third interlayer insulating film 317 formed using an insulating material is formed over the second interlayer insulating film 316 (see FIG. 8D). An insulating film obtained by CVD can be used for the third interlayer insulating film 317. In this embodiment mode, in order to improve adhesion, a silicon oxide film including nitrogen is formed with a thickness of 900 nm as the third interlayer insulating film 317.

Next, heat treatment (heat treatment at 300 to 550° C. for 1 to 12 hours, e.g., at 410° C. for 1 hour in a nitrogen atmosphere) is performed to hydrogenate the island-shaped semiconductor regions 331. This step is performed to terminate a dangling bond of the island-shaped semiconductor regions 331 by hydrogen included in the second interlayer insulating film 316. The island-shaped semiconductor regions 331 can be hydrogenated regardless of whether or not the gate insulating film 313 is formed.

Alternatively, as the third interlayer insulating film 317, an insulating film using siloxane and a stacked-layer structure thereof can be used. Siloxane is formed using a skeleton structure of a bond of silicon (Si) and oxygen (O). An organic group including at least hydrogen (e.g., an alkyl group or aromatic hydrocarbon) is used as a substituent. Further alternatively, a fluorine may be used as the organic group.

In the case where an insulating film using siloxane and a stacked-layer structure thereof are used as the third interlayer insulating film 317, after formation of the second interlayer insulating film 316, heat treatment for hydrogenating the island-shaped semiconductor regions 331 is performed and then the third interlayer insulating film 317 can be formed.

Subsequently, a mask formed from a resist is formed using a third photomask, and the first interlayer insulating film, the second interlayer insulating film 316, the third interlayer insulating film 317, and the gate insulating film 313 are selectively etched to form contact holes. Then, the mask formed from the resist is removed.

Note that the third interlayer insulating film 317 may be formed as necessary. In the case where the third interlayer insulating film 317 is not formed, the first interlayer insulating film, the second interlayer insulating film 316, and the gate insulating film 313 are selectively etched after formation of the second interlayer insulating film 316 to form contact holes.

Next, after a metal stacked film is formed by sputtering, a mask formed from a resist is formed using a fourth photomask, and the metal film is selectively etched to form a wiring 319, a connection electrode 320, a terminal electrode 351, and a source electrode or drain electrode 341 of the TFT 113. Then, the mask formed from the resist is removed. Note that the metal film of this embodiment mode is a stacked-layer film of three layers: a Ti film with a thickness of 100 nm, an Al film including a slight amount of Si with a thickness of 350 nm, and a Ti film with a thickness of 100 nm.

In addition, in a case where each of the wiring 319, the connection electrode 320, the terminal electrode 351, the source electrode or drain electrode 341 of the TFT 113 is formed of a single-layer conductive film, a titanium film (Ti film) is preferable in terms of heat resistance, conductivity, and the like. Instead of a titanium film, a single-layer film formed from an element selected from tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir) and platinum (Pt), or an alloy material or a compound material containing the above element as its main component; a single-layer film formed from nitride thereof, for example, titanium nitride, tungsten nitride, tantalum nitride, or molybdenum nitride may be used. The number of steps of deposition can be reduced in the manufacturing process, by formation of each of the wiring 319, the connection electrode 320, the terminal electrode 351, and the source electrode or drain electrode 341 of the TFT 113 as a single-layer film.

The top gate TFT 113 using a polycrystalline silicon film can be manufactured through the process described above.

Figure 9A:
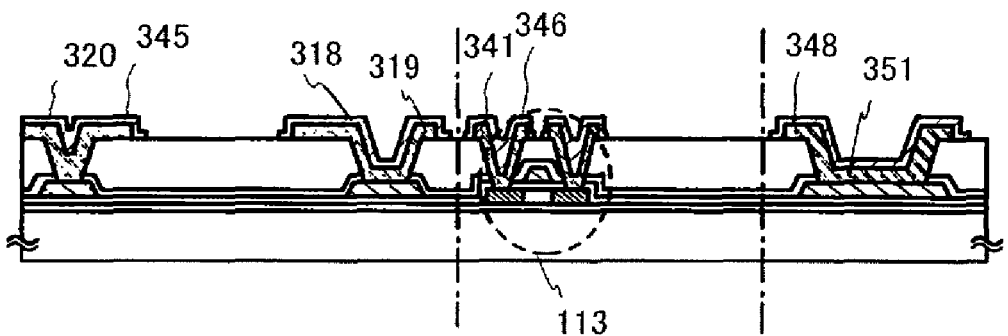
FIGS. 9A to 9C are diagrams illustrating the manufacturing method of the photo electric conversion circuit of the present invention.

Subsequently, after formation of a conductive metal film (e.g., titanium (Ti) or molybdenum (Mo)) which does not easily become an alloy by reacting with a photoelectric conversion layer (typically, amorphous silicon) which is formed later, a mask formed from a resist is formed using a fifth photomask, and the conductive metal film is selectively etched to form a protective electrodes 318 which cover the wiring 319 (see FIG. 9A). Here, a Ti film with a thickness of 200 nm which is obtained by sputtering is used. Note that the connection electrode 320, the terminal electrode 351, and the source electrode and drain electrode 341 of the TFT 113 are covered with protective electrodes 345, 346 and 348, which are conductive metal films, respectively. Therefore, the conductive metal film also covers a side face where the Al film in the second layer is exposed in these electrodes, so that the conductive metal film can also prevent diffusion of aluminum atoms to the photoelectric conversion layer.

Note that in a case where each of the wiring 319, the connection electrode 320, the terminal electrode 351, and the source electrode or drain electrode 341 of the TFT 113 are formed as a single-layer conductive film, the protective electrodes 318, 345, 346, and 348 are not necessarily formed.

Next, a photoelectric conversion layer 111 including a p-type semiconductor layer 111p, an i-type semiconductor layer 111i, and an n-type semiconductor layer 111n is formed over the third interlayer insulating film 317.

The p-type semiconductor layer 111p may be formed using a semi-amorphous silicon film including an impurity element belonging to Group 13 in the periodic table, e.g., boron (B) by plasma CVD.

Note that the wiring 319 and the protective electrode 318 are in contact with the bottom layer of the photoelectric conversion layer 111, i.e., the p-type semiconductor layer 111p in this embodiment mode.

After the p-type semiconductor layer 111p is formed, the i-type semiconductor layer 111i and the n-type semiconductor layer 111n are sequentially formed. Thus, the photoelectric conversion layer 111 including the p-type semiconductor layer 111p, the i-type semiconductor layer 111i, and the n-type semiconductor layer 111n is formed.

As the i-type semiconductor layer 111i, for example, a semi-amorphous silicon film may be formed by plasma CVD. In addition, as the n-type semiconductor layer 111n, a semi-amorphous silicon film including an impurity element belonging to Group 15 in the periodic table, e.g., phosphorus (P) may be formed. Alternatively, after a semi-amorphous silicon film is formed, an impurity element belonging to Group 15 in the periodic table may be introduced.

Alternatively, an amorphous semiconductor film as well as a semi-amorphous semiconductor film may be used for each of the p-type semiconductor layer 111p, the i-type semiconductor layer 111i, and the n-type semiconductor layer 111n.

Figure 9B:
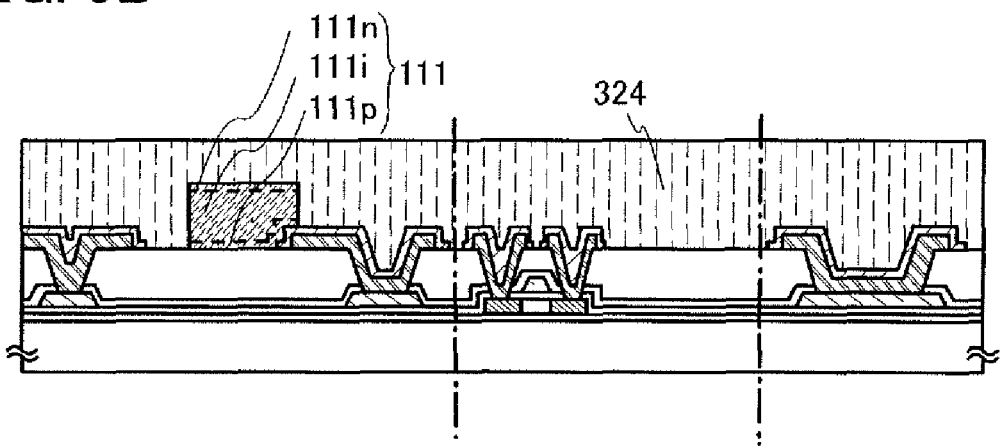

Subsequently, a sealing layer 324 formed from an insulating material (e.g., an inorganic insulating film including silicon) is formed with a thickness of 1 to 30 μm over an entire surface resulting in a structure shown in FIG. 9B. Here, as an insulating material film, a silicon oxide film including nitrogen with a thickness of 1 μm is formed by CVD. By using an insulating film formed by CVD, adhesiveness can be improved.

Subsequently, after the sealing layer 324 is etched to provide opening portions, terminal electrodes 121 and 122 are formed by sputtering. Each of the terminal electrodes 121 and 122 is formed of a stacked-layer film of a titanium film (a Ti film) (100 nm), a nickel film (a Ni film) (300 nm), and a gold film (a Au film) (50 nm). The terminal electrodes 121 and 122 obtained in this manner have a fixing intensity of higher than 5 N, which is sufficient fixing intensity as a terminal electrode.

Figure 9C:
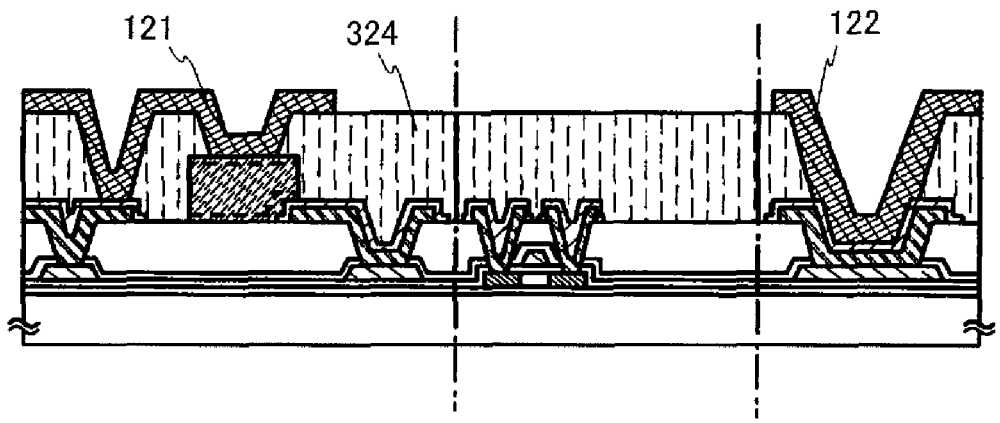

By the above-described process, the terminal electrode 121 and the terminal electrode 122 which can be connected by a solder are formed, and a structure shown in FIG. 9C can be obtained.

Note that a substrate may be cut into individual pieces to obtain a plurality of photoelectric conversion circuit elements, so that the photoelectric conversion circuits obtained through the above-described steps can be mass-produced. A large number of photoelectric conversion elements (e.g., 2 mm×1.5 mm) can be manufactured from one large substrate (e.g., 600 cm×720 cm).

Note that as a manufacturing method of the island-shaped semiconductor region 331 shown in this embodiment mode, other manufacturing method can be employed without being limited to the above-described manufacturing method. For example, the island-shaped semiconductor region 331 can be formed by using an SOI (silicon on insulator) substrate. It is acceptable as long as a known SOI substrate is used as the SOI substrate, and a manufacturing method and a structure thereof are not particularly limited to particular types. As the SOI substrate, a SIMOX substrate and a bonded substrate can be typically given. In addition, examples of the bonded substrate are ELTRAN (registered trademark), UNIBOND (registered trademark), Smart Cut (registered trademark), and the like.

In the case of the SIMOX substrate, an oxygen ion is implanted into a single-crystal silicon substrate, and heat treatment at 1300° C. or more is performed to form a buried oxide (BOX) film layer; thus, a thin-film silicon layer is formed on the surface of the single-crystal silicon substrate, and an SOI structure can be obtained. The thin-film silicon layer is insulated from the single-crystal silicon substrate with the buried oxide film layer. Further, a technique called ITOX (internal thermal oxidation) in which further thermal oxidation is performed can be used after the buried oxide film layer is formed.

A bonded substrate is an SOI substrate in which two single-crystal silicon substrates (a first single-crystal silicon substrate and a second single-crystal silicon substrate) are bonded with an oxide film layer interposed therebetween and one of the single-crystal silicon substrates is thinned from a surface on the side which is opposite to the bonded side, whereby a thin-film silicon layer is formed on the surface of the single-crystal silicon substrate. The oxide film layer can be formed by thermal oxidation of one of the substrates (here the first single crystal silicon substrate). Further, the two single-crystal silicon substrates can be bonded directly without using an adhesive.

As the bonded substrate, an SOI substrate can be formed by bonding a glass substrate, a flexible substarte having an insulating surface or the like and a single-crystal semiconductor substrate, without being limited to bonding of two single-crystal semiconductor substrates. The SOI substrate formed by bonding a glass substrate and a single-crystal semiconductor substrate is described with reference to FIGS. 10A to 10D.

Figure 10A:
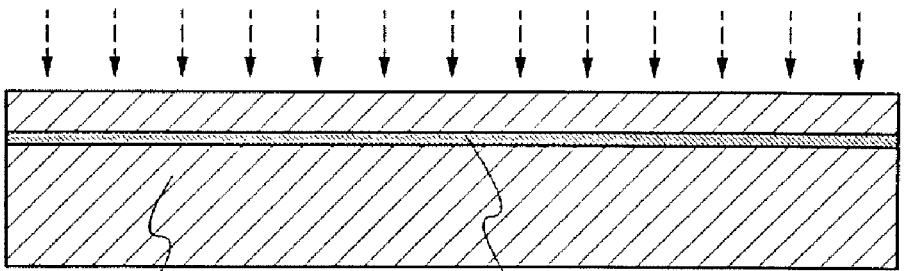
FIGS. 10A to 10D are diagrams illustrating a manufacturing method of a photoelectric conversion circuit of the present invention.

A single-crystal semiconductor substrate 1101 shown in FIG. 10A is cleaned, and ions which are accelerated by an electric field are added to reach a predetermined depth from the surface of the semiconductor substrate 1101 to form a weakened layer 1103. Ions are added in consideration of the thickness of a semiconductor film which is to be transferred to a base substrate. The thickness of the semiconductor film is set to be 5 nm to 500 nm, preferably 10 nm to 200 nm, more preferably 10 nm to 100 nm, and still more preferably 10 nm to 50 nm. Accelerating voltage for adding ions to the single-crystal semiconductor substrate 1101 is set in consideration of such a thickness. Since the surface of the semiconductor film is flattened by polishing or melting after separation, the thickness of the semiconductor film right after separation is preferably set to be 50 nm to 500 nm.

The weakened layer 1103 is formed by adding ions of hydrogen, helium, or halogen typified by fluorine. In this case, it is preferable to add one kind of ions or plural kinds of ions of different mass numbers consisting of a single kind of atoms. In the case of adding hydrogen ions, the hydrogen ions preferably include $H^+$, $H_2^+$, and $H_3^+$ ions with a high proportion of $H_3^+$ ions. With a high proportion of $H_3^+$ ions, addition efficiency can be increased and addition time can be shortened. This structure enables separation at the weakened layer 1103 to be easily performed later.

In the case where ions are added to the single-crystal semiconductor substrate 1101, ions are necessary to be added with high dose condition, whereby the surface of the single-crystal semiconductor substrate 1101 becomes rough in some cases. Therefore, it is preferable to form a protective layer against ion addition by using a silicon oxide layer, a silicon nitride layer, a silicon nitride oxide layer, or the like with a thickness of from 50 nm to 200 nm over a surface, to which ions are added, to prevent the surface from being damaged by ion doping and losing flatness.

Figure 10B:
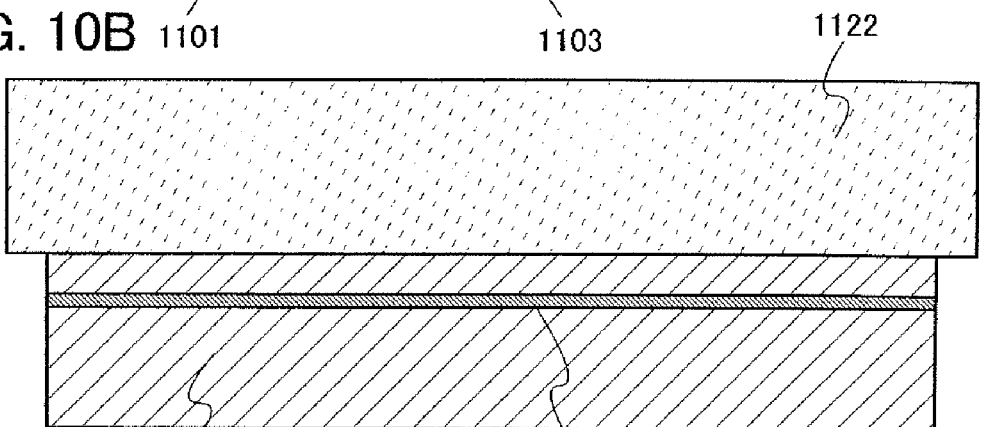

Next, as shown in FIG. 10B, a pressure bonding material 1122 is provided on the surface of the single-crystal semiconductor substrate 1101. Then, the single-crystal semiconductor substrate 1101 and the pressure bonding material 1122 are attached to each other and heated, that is, thermal treatment and pressure treatment are performed in order to separate the single-crystal semiconductor substrate 1101 from a glass substrate 1100 easily by using the weakened layer 1103 as a cleavage plane in a later step. The temperature of the thermal treatment is preferably a temperature which is lower than a temperature at which the weakened layer 1103 cleaves and at which the weakened layer 1103 becomes weak. For example, when the thermal treatment is performed at a temperature lower than 400° C., preferably lower than 350° C., or more preferably lower than 300° C., volume of minute cavities formed in the weakened layer 1103 changes; however, since the pressure bonding material 1122 is provided on the surface of the single-crystal semiconductor substrate, the surface of the single-crystal semiconductor substrate can keep flat. As a result, change in the volume of the minute cavities in the weakened layer 1103 generates a distortion in the weakened layer 1103 and a portion of the single-crystal semiconductor substrate 1101 along the weakened layer 1103 can be weakened. The pressure treatment is performed so as to apply pressure perpendicularly to a bonding surface in consideration of pressure resistance of the glass substrate 1100 and the single-crystal semiconductor substrate 1101.

Figure 10C:
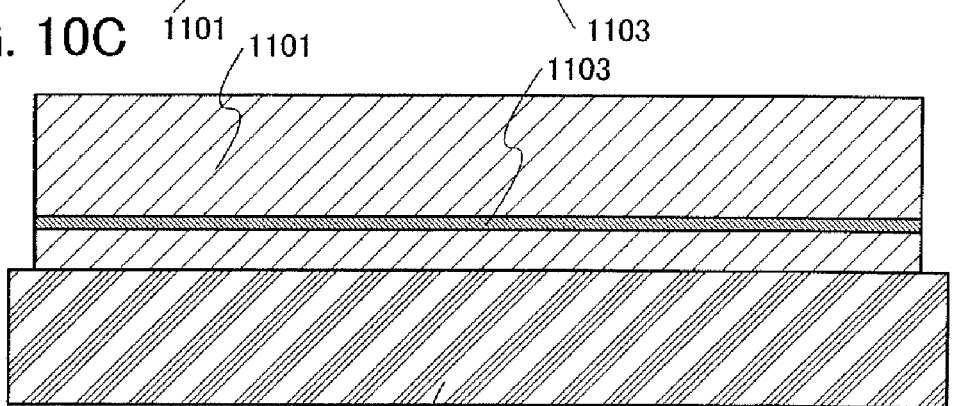

As shown in FIG. 10C, the glass substrate 1100 and the single-crystal semiconductor substrate 1101 are attached to each and bonded to each other. Surfaces to be bonded are adequately cleaned. Then, the glass substrate 1100 and the single-crystal semiconductor substrate 1101 are attached while pressure is applied thereon, whereby the glass substrate 1100 and the single-crystal semiconductor substrate 1101 are bonded to each other. The bond is formed by Van der Waals forces. By pressing the glass substrate 1100 and the single-crystal semiconductor substrate 1101 against each other, a stronger bond can be formed by hydrogen bond.

In order to obtain a favorable bond, surfaces are preferably activated. For example, the surface to be bonded is irradiated with an atomic beam or an ion beam. When an atomic beam or an ion beam is used, an inert gas neutral atom beam or inert gas ion beam of argon or the like can be used. Alternatively, plasma irradiation or radical treatment is performed. Further, at least one of the bonding surfaces of the glass substrate and the single-crystal semiconductor substrate may be subjected to treatment by oxygen plasma or washing with ozone water to be hydrophilic. Such a surface treatment makes it possible to easily perform bonding between different kinds of materials even at a temperature lower than 400° C.

Instead of the heat treatment which has been performed before the glass substrate 1100 and the single-crystal semiconductor substrate 1101 are bonded to each other, after the glass substrate 1100 and the single-crystal semiconductor substrate 1101 are bonded to each other, the single-crystal semiconductor substrate 1101 may be irradiated with a laser beam from the glass substrate 1100 side to heat the weakened layer 1103. As a result, the weakened layer is weakened and the single-crystal semiconductor substrate 1101 can be separated from the glass substrate 1100 by using the weakened layer as a cleavage plane.

Figure 10D:
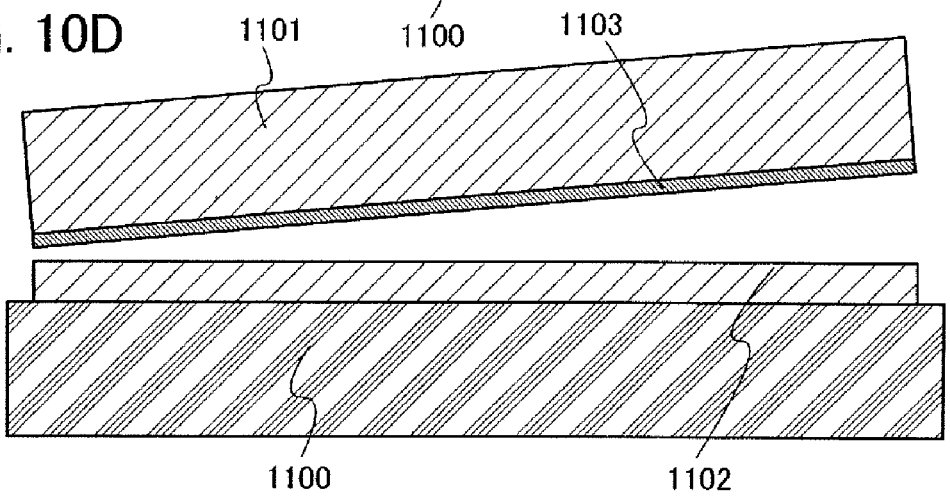

As shown in FIG. 10D, after the glass substrate 1100 and the single-crystal semiconductor substrate 1101 are bonded to each other, the single-crystal semiconductor substrate 1101 is separated from the glass substrate 1100 using the weakened layer 1103 as a cleavage plane so that the SOI substrate can be obtained. Since the surface of the single-crystal semiconductor substrate 1101 and the glass substrate 1100 are bonded to each other, a semiconductor film 1102 whose crystallinity is the same as that of the single-crystal semiconductor substrate 1101 remains over the glass substrate 1100.

Before the single-crystal semiconductor substrate 1101 is separated from the glass substrate 1100 by using the weakened layer 1103 as a cleavage plane, a trigger for easy separation is preferably provided. In specific, pretreatment for reducing adhesiveness of the weakened layer 1103 and the semiconductor film 1102 as selected (partly) is performed so that a separation defect is reduced and a yield is improved. Typically, for example, a trench is formed in the weakened layer 1103 by performing laser beam irradiation from the glass substrate 1100 side or the single-crystal semiconductor substrate 1101 side, or by using a dicer.

When the single-crystal semiconductor substrate 1101 is separated from the glass substrate 1100, an adhesive sheet which can be separated by light or heat is provided for at least one of the surfaces of the glass substrate 1100 and the single-crystal semiconductor substrate 1101 to fix one of the glass substrate 1100 and the single-crystal semiconductor substrate 1101, and the other is separated, so that separation can be performed more easily. At that time, by provision of a supporting member for the other of the glass substrate 1100 and the single-crystal semiconductor substrate 1101, a separation process can be easily carried out.

The surface of a semiconductor film obtained by the separation is preferably polished to be flat by chemical mechanical polishing (CMP). Alternatively, the flattening may be performed by irradiating the surfaces of the semiconductor film with a laser beam instead of using a physical polishing means such as CMP. Note that the laser beam irradiation is preferably conducted under a nitrogen atmosphere having an oxygen concentration of 10 ppm or lower. This is because the surface of the semiconductor film might get rough if irradiation with a laser beam is performed under an oxygen atmosphere. In addition, CMP or the like may be performed in order to reduce the thickness of the obtained semiconductor film.

The above description is a method for manufacturing an SOI substrate by attaching a substrate having an insulating surface, such as a glass substrate, and a single-crystal semiconductor substrate to each other.

In addition, as the island-shaped semiconductor region 331 shown in this embodiment mode, a microcrystalline semiconductor film can be used without being limited to a polycrystalline semiconductor film and a single-crystal semiconductor film.

The microcrystalline semiconductor film is a film including a semiconductor having an intermediate structure between amorphous and crystalline (including single-crystal and polycrystalline) structures. This semiconductor has a third state which is stable in terms of free energy, and is a crystalline substance having short-range order and lattice distortion. This semiconductor can be dispersed in an amorphous semiconductor with its grain size of 0.5 to 20 nm. In microcrystalline silicon which is a typical example of microcrystalline semiconductors, its Raman spectrum is shifted to a lower wave number side than 521 $cm^{-1}$ which represents single-crystal silicon. That is, the microcrystalline silicon has a peak of the Raman spectrum between 481 $cm^{-1}$ and 520 $cm^{-1}$. The microcrystalline silicon includes hydrogen or halogen of at least 1 at. % to terminate a dangling bond. Moreover, a rare gas element such as helium, argon, krypton, or neon may be included to further promote lattice distortion, so that stability is enhanced and a favorable microcrystalline semiconductor film can be obtained. Such description about a microcrystalline semiconductor film is disclosed in, for example, U.S. Pat. No. 4,409,134.

This microcrystalline semiconductor film can be formed by high-frequency plasma CVD with a frequency of several tens of MHz to several hundreds of MHz or a microwave plasma CVD apparatus with a frequency of 1 GHz or more. Typically, the microcrystalline semiconductor film can be formed by diluting silicon hydride such as $SiH_4$, $Si_2H_6$, $SiH_2Cl_2$, $SiHCl_3$, $SiCl_4$, or $SiF_4$ with hydrogen. Alternatively, in addition to silicon hydride and hydrogen, the microcrystalline semiconductor film can be formed by diluting the silicon hydride with one or a plurality of kinds of rare gas element selected from helium, argon, krypton or neon. At that time, a flow ratio of hydrogen is more than or equal to 5 times and less than or equal to 200 times, preferably more than or equal to 50 times and less than or equal to 150 times, further preferably 100 times a flow ratio of silicon hydride.

The microcrystalline semiconductor film has weak n-type conductivity when an impurity element for controlling valence electrons is not added thereto intentionally. Therefore, an impurity element imparting p-type conductivity may be added to the microcrystalline semiconductor film which functions as a channel-forming region of a thin film transistor at the same time as or after formation of the microcrystalline semiconductor film, so that the threshold voltage can be controlled. A typical example of the impurity element imparting p-type conductivity is boron, and an impurity gas such as $B_2H_6$ or $BF_3$ may be added to silicon hydride at a proportion of 1 ppm to 1000 ppm, preferably 1 ppm to 100 ppm. The concentration of boron is preferably set at $1\times10^{14}$ to $6\times10^{16}$ atoms/$cm^3$.

The concentration of oxygen in the microcrystalline semiconductor film is $5\times10^{18}$ $cm^{-3}$ or lower, preferably $1\times10^{18}$ $cm^{-3}$ or lower. Each concentration of nitrogen and carbon therein is preferably $1\times10^{19}$ $cm^{-3}$ or lower. By reducing the concentration of oxygen, nitrogen, and carbon mixed into the microcrystalline semiconductor film, the microcrystalline semiconductor film can be prevented from having n-type conductivity.

The island-shaped semiconductor region 331 made of microcrystalline semiconductor film is formed with a thickness of more than 0 nm and less than or equal to 50 nm, preferably more than 0 nm and less than or equal to 20 nm. The microcrystalline semiconductor film functions as a channel-forming region of a thin film transistor which is to be formed later. By setting the thickness of the microcrystalline semiconductor film in the above-mentioned range, the thin film transistor which is to be formed later becomes fully-depleted. In addition, since the microcrystalline semiconductor film is formed of micro crystals, the resistance of the microcrystalline semiconductor film is lower than that of an amorphous semiconductor film. Further, in the case of a thin film transistor using the microcrystalline semiconductor film, a slope of rising of a curve representing a current-voltage characteristic is steep and responsiveness as a switching element is improved and high-speed operation is possible. In addition, by using the microcrystalline semiconductor film for the channel-forming region of the thin film transistor, a variation between threshold voltages of thin film transistors can be suppressed. Therefore, a liquid crystal display device or the like with few variations in an electric characteristic can be manufactured.

In addition, the mobility of the microcrystalline semiconductor film is higher than that of the amorphous semiconductor film. Thus, by using a thin film transistor whose channel-forming region is formed of the microcrystalline semiconductor film as a switching of a display element, the area of the channel-forming region, that is, the area of the thin film transistor can be reduced. Therefore, the area of the thin film transistor in one pixel is reduced and an aperture ratio of the pixel can be improved. As a result, a device with high resolution can be manufactured.

Note that this embodiment mode can be combined with the technical features of the other embodiment modes in this specification.

Embodiment Mode 4

In this embodiment mode, an example of a manufacturing method of a photoelectric conversion circuit described in the above embodiment modes, which is different from that shown in Embodiment Mode 2, is shown with reference to a cross-sectional diagram. In this embodiment mode, a structure in which a field effect transistor is formed of a bottom gate TFT is shown with reference to FIGS. 11A to 11D, FIGS. 12A to 12C, and FIG. 13.

Figure 11A:
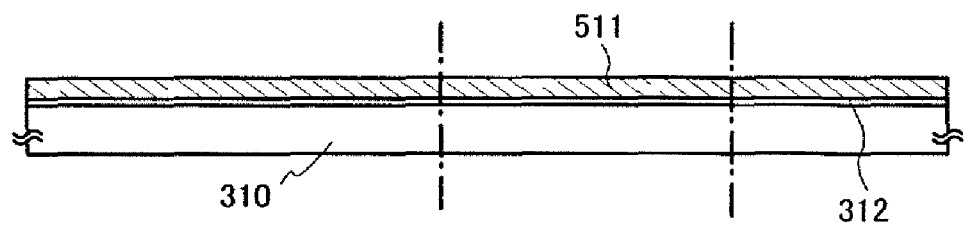
FIGS. 11A to 11E are diagrams illustrating a manufacturing method of a photoelectric conversion circuit of the present invention.

First, a base insulating film 312 and a metal film 511 are formed over a substrate 310 (see FIG. 11A). In this embodiment mode, a stacked-layer film of tantalum nitride with a thickness of 30 nm and tungsten with a thickness of 370 nm is used for the metal film 511, for example.

Alternatively, for the metal film 511, a single-layer film formed from an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), platinum (Pt), aluminum (Al), gold (Au), silver (Ag), or copper (Cu), an alloy material or a compound material including the above-described element as a main component, or a single-layer film formed from nitride of the above-described elements such as titanium nitride, tungsten nitride, tantalum nitride, or molybdenum nitride can be used.

Note that the metal film 511 may be formed directly on the substrate 310 without forming the base insulating film 312 over the substrate 310.

Figure 11B:
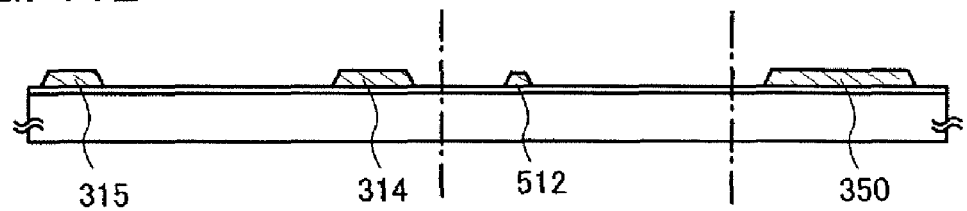
Figure 11C:
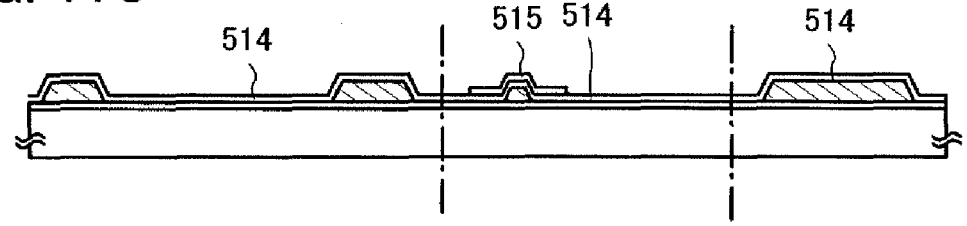

Next, a gate electrode 512, wirings 314 and 315, and a terminal electrode 350 are formed by using the metal film 511 (see FIG. 11B).

Subsequently, a gate insulating film 514 which covers the gate electrode 512, the wirings 314 and 315, and the terminal electrode 350 is formed. In this embodiment mode, the gate insulating film 514 is formed using an insulating film including silicon as a main component, for example, a silicon oxide film including nitrogen (composition ratio of Si=32%, O=59%, N=7%, H=2%) formed with a thickness of 115 nm by plasma CVD.

Next, an island-shaped semiconductor region 515 is formed over the gate insulating film 514. The island-shaped semiconductor region 515 is formed using materials and a manufacturing process which are similar to those of the island-shaped semiconductor region 331 described in Embodiment Mode 2 (see FIG. 11C).

Figure 11D:
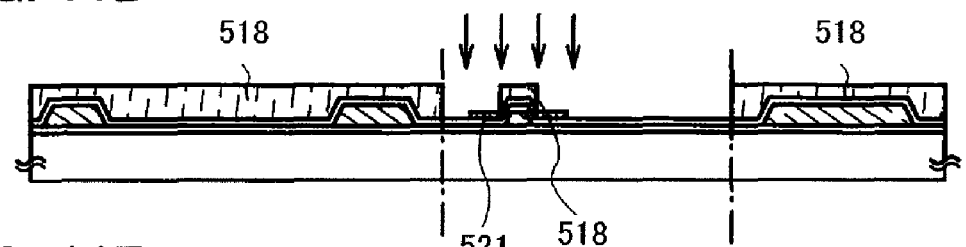

After the island-shaped semiconductor region 515 is formed, a mask 518 is formed covering portions except for regions which later serve as a source region and drain region 521 of a TFT 503, and an impurity which imparts one conductivity type is introduced (see FIG. 11D). As the one conductivity-type impurity, phosphorus (P) or arsenic (As) may be used as an n-type impurity in the case of forming an n-channel TFT, and boron (B) may be used as a p-type impurity in the case of forming a p-channel TFT. In this embodiment mode, phosphorus (P) which is an n-type impurity is introduced into the island-shaped semiconductor region 515 to form the source region and drain region 521 of the TFT 503 and a channel-forming region between these regions.

Figure 11E:
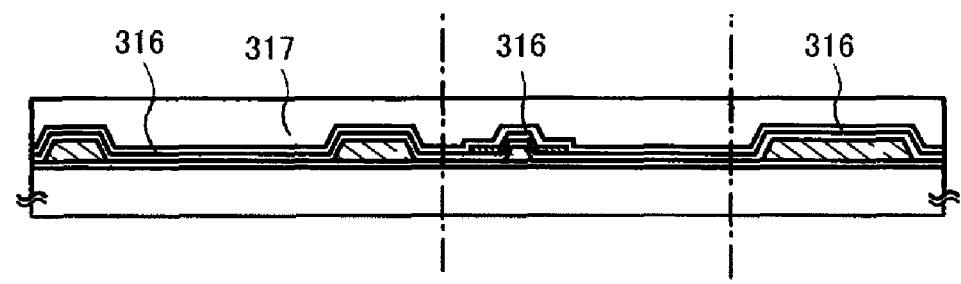

Next, the mask 518 is removed, and the first interlayer insulating film which is not shown, the second interlayer insulating film 316, and the third interlayer insulating film 317 are formed (see FIG. 11E). It is acceptable as long as materials and a manufacturing process of the first interlayer insulating film, the second interlayer insulating film 316, and the third interlayer insulating film 317 are based on the description in Embodiment Mode 2.

Contact holes are formed in the gate insulating film 514, the first interlayer insulating film, the second interlayer insulating film 316, and the third interlayer insulating film 317, and a metal film is formed. In addition, the metal film is selectively etched to form the wiring 319, the connection electrode 320, the terminal electrode 351, the source electrode and drain electrode 531 of the TFT 503. Then, the mask formed from a resist is removed. Note that the metal film of this embodiment mode is a stacked-layer film of three layers of a Ti film with a thickness of 100 nm, an Al film including a slight amount of silicon with a thickness of 350 nm, and a Ti film with a thickness of 100 nm. Then protective electrodes 318, 533, 536 and 538 are formed.

Alternatively, as the wiring 319 and the protective electrode 318 thereof; the connection electrode 320 and the protective electrode 533 thereof; the terminal electrode 351 and the protective electrode 538 thereof; the source electrode and drain electrode 531 of the TFT 503 and the protective electrode 536 thereof, each wiring and electrode may be formed using a single-layer conductive film.

Figure 12A:
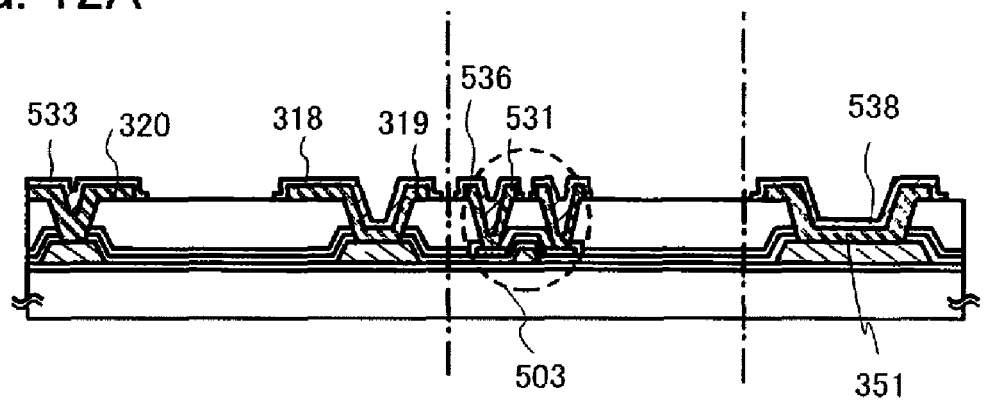
FIGS. 12A to 12C are diagrams illustrating the manufacturing method of the photoelectric conversion circuit of the present invention.

Through the above-described process, the bottom-gate TFT 503 can be manufactured (see FIG. 12A).

Figure 12B:
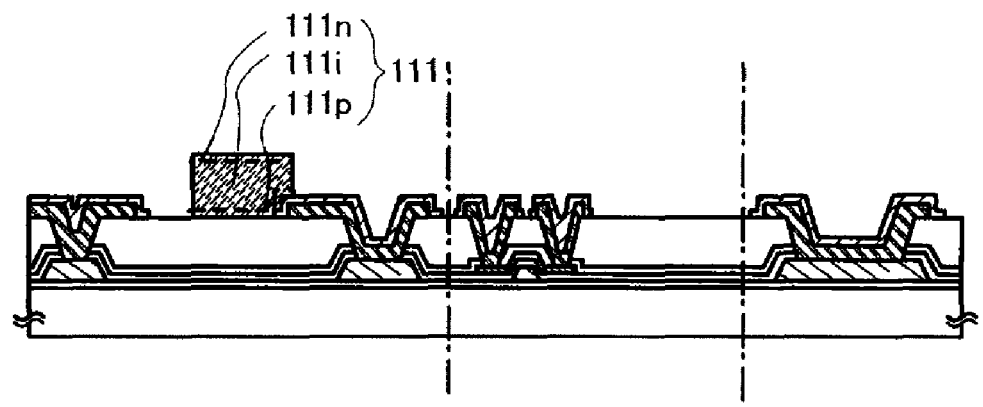

Next, the photoelectric conversion layer 111 including the p-type semiconductor layer 111*p*, the i-type semiconductor layer 111*i*, and the n-type semiconductor layer 111*n* is formed over the third interlayer insulating film 317 (see FIG. 12B). As for a material, a manufacturing process, and the like of the photoelectric conversion layer 111, Embodiment Mode 2 is referred to.

Figure 12C:
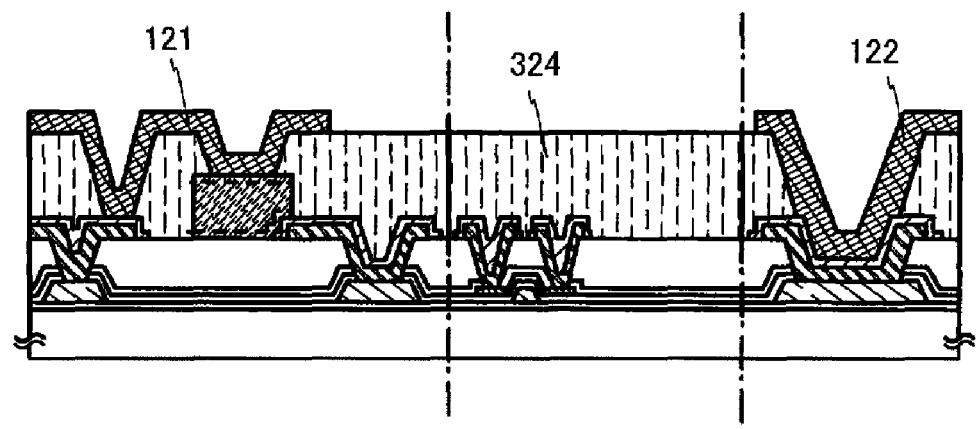

Subsequently, the sealing layer 324 and the terminal electrodes 121 and 122 are formed (see FIG. 12C). The terminal electrode 121 is connected to the n-type semiconductor layer 111*n* and the terminal electrode 122 is formed by the same process as the terminal electrode 121.

Further, a substrate 360 having electrodes 361 and 362 is mounted using solders 364 and 363. Note that the electrode 361 on the substrate 360 is connected to the terminal electrode 121 by the solder 364. In addition, the electrode 362 on the substrate 360 is connected to the terminal electrode 122 by the solder 363 (see FIG. 13).

Figure 13:
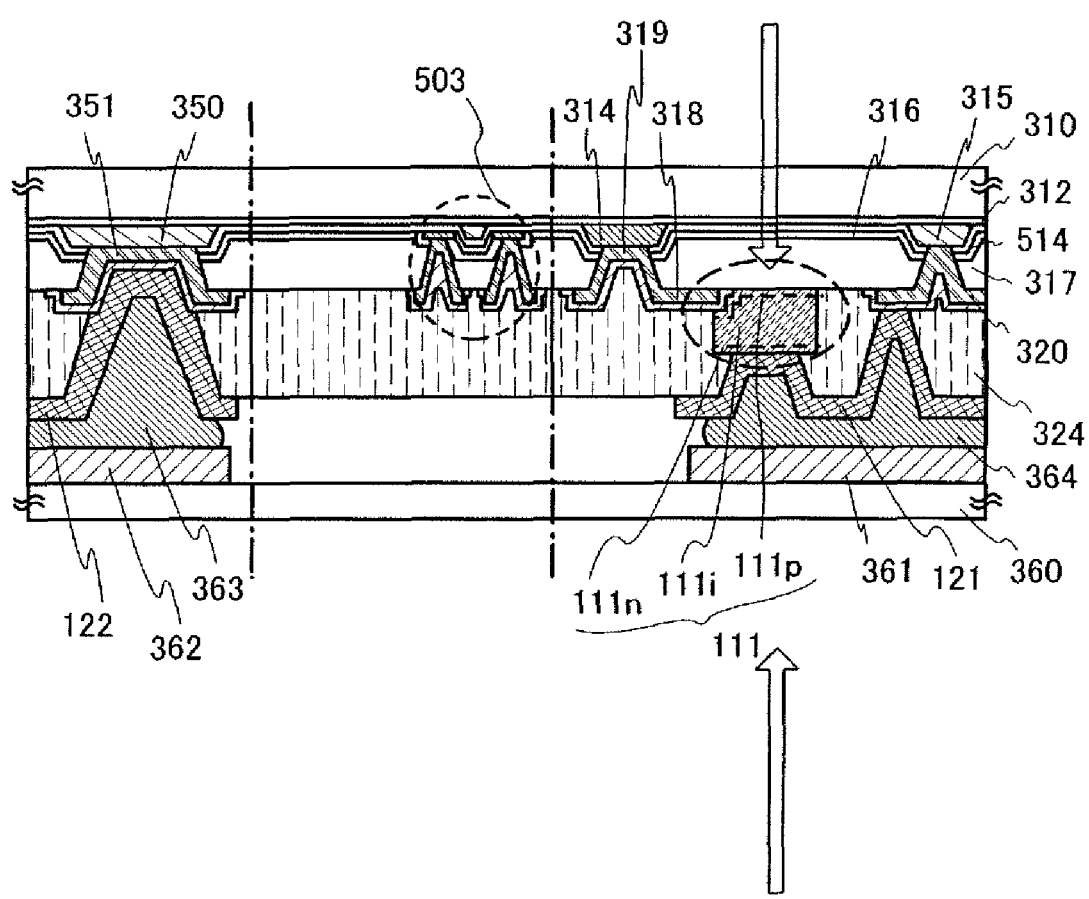
FIG. 13 is a cross-sectional view of a photoelectric conversion circuit of the present invention.

In a photoelectric conversion circuit shown in FIG. 13, light which enters the photoelectric conversion layer 111 can enter from both the substrate 310 side and the substrate 360 side by using the substrate 310 and the substrate 360 which have light-transmitting property.

Note that this embodiment mode can be combined with the technical features of the other embodiment modes in this specification.

Embodiment Mode 5

This embodiment mode will show examples in each of which a photoelectric conversion device of the present invention is provided in a housing to control the direction of light which enters, with reference to FIGS. 14A to 14B and FIGS. 15A and 15B.

Figure 14A:
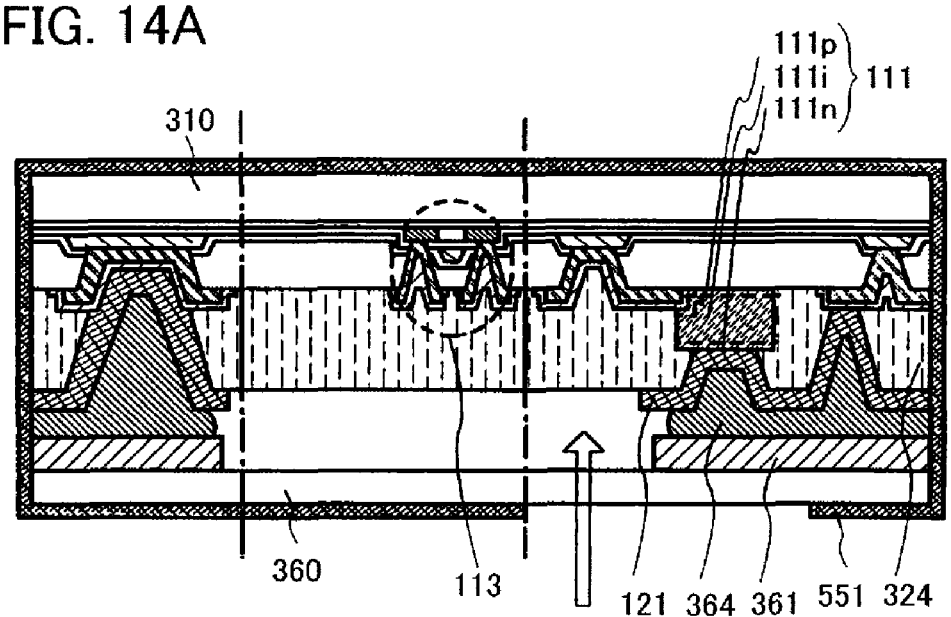
FIGS. 14A and 14B are cross-sectional views of photoelectric conversion circuits of the present invention.

FIG. 14A shows that after the electrode 361 over the substrate 360 is connected to the terminal electrode 121 in a photoelectric conversion device shown in FIG. 9C by the solder 364, a housing 551 is formed so that light enters the photoelectric conversion layer 111 not from a substrate 310 side but from a substrate 360 side. The housing 551 is provided with an opening portion in a region where the photoelectric conversion layer 111 on the substrate 360 side is formed.

In FIG. 14A, there are the terminal electrode 121, the electrode 361, and the solder 364; however, light which enters from the substrate 360 side enters diagonally through the sealing layer 324. Accordingly, a photocurrent can be generated and light can be detected.

In addition, any material can be used for the housing 551 and housings 552 to 554 that are described below as long as it has function of shielding light. For example, a resin material or the like having a metal material or a black pigment may be used.

Figure 14B:
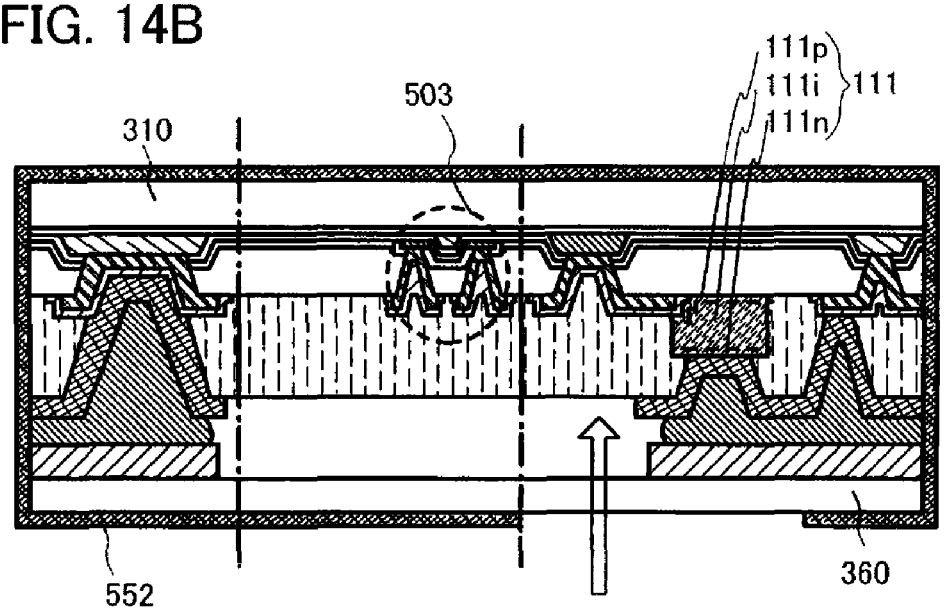

In FIG. 14B, the photoelectric conversion circuit shown in FIG. 13 is provided with the housing 552 so that light enters the photoelectric conversion layer 111 not from the substrate 310 side but from the substrate 360 side. The housing 552 is provided with an opening portion in a region where the photoelectric conversion layer 111 on the substrate 360 side is formed.

In FIG. 14B as well as FIG. 14A, the light which enters from the substrate 360 side enters the photoelectric conversion layer 111 diagonally through the sealing layer 324, so that the photocurrent is generated and light can be detected.

Figure 15A:
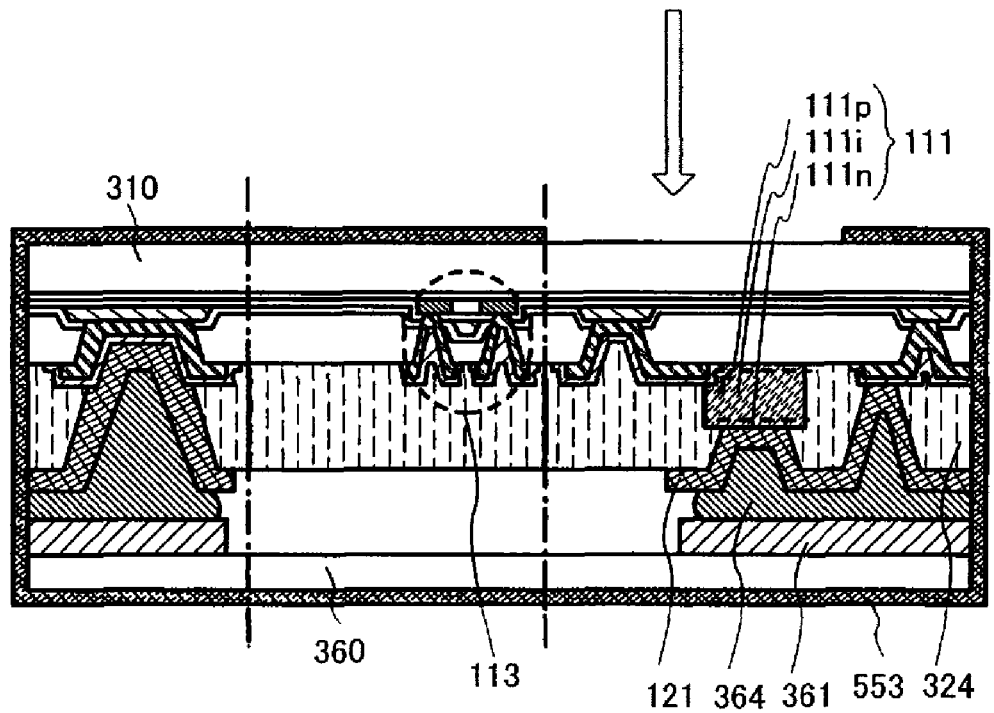
FIGS. 15A and 15B are cross-sectional views of photoelectric conversion circuits of the present invention.

FIG. 15A shows that after the electrode 361 over the substrate 360 is mounted on the terminal electrode 121 in a photoelectric conversion device shown in FIG. 9C by the solder 364, the housing 553 is formed so that light enters the photoelectric conversion layer 111 not from the substrate 360 side but from the substrate 310 side. The housing 553 is provided with an opening portion in a region where the photoelectric conversion layer 111 on the substrate 310 side is formed.

In FIG. 15A, the light which enters from the substrate 310 side enters the photoelectric conversion layer 111 directly through the third interlayer insulating film 317, so that the photocurrent is generated and light can be detected.

Figure 15B:
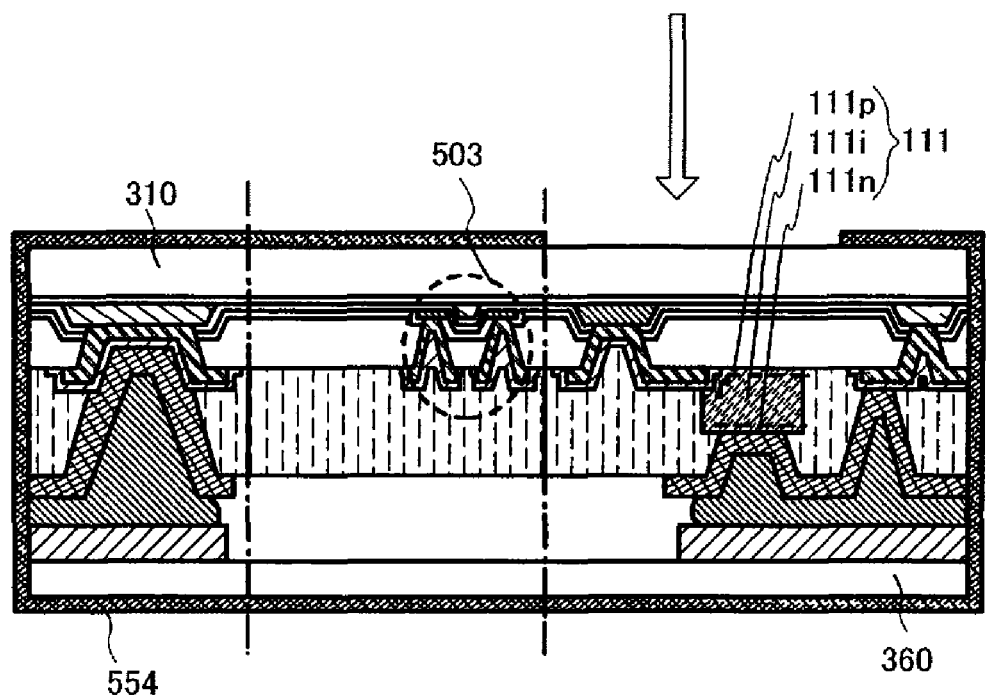

In FIG. 15B, the photoelectric conversion circuit shown in FIG. 13 is provided with the housing 554 so that light enters the photoelectric conversion layer 111 not from the substrate 360 side but from the substrate 310 side. The housing 554 is provided with an opening portion in a region where the photoelectric conversion layer 111 on the substrate 310 side is formed.

In FIG. 15B, the light which enters from the substrate 310 side enters the photoelectric conversion layer 111 directly through the third interlayer insulating film 317, so that the photocurrent is generated and light can be detected.

Note that this embodiment mode can be combined with the technical features of the other embodiment modes in this specification.

Embodiment Mode 6

In this embodiment mode, examples in each of which a photoelectric conversion device obtained by using the present invention is incorporated in various electronic devices is described. As examples of electronic devices to which the present invention is applied, a computer, a display, a mobile phone, a television receiver, and the like can be given. Specific examples of those electronic devices are shown in FIG. 16, FIGS. 17A and 17B, FIGS. 18A and 18B, FIG. 19, and FIGS. 20A and 20B.

Figure 16:
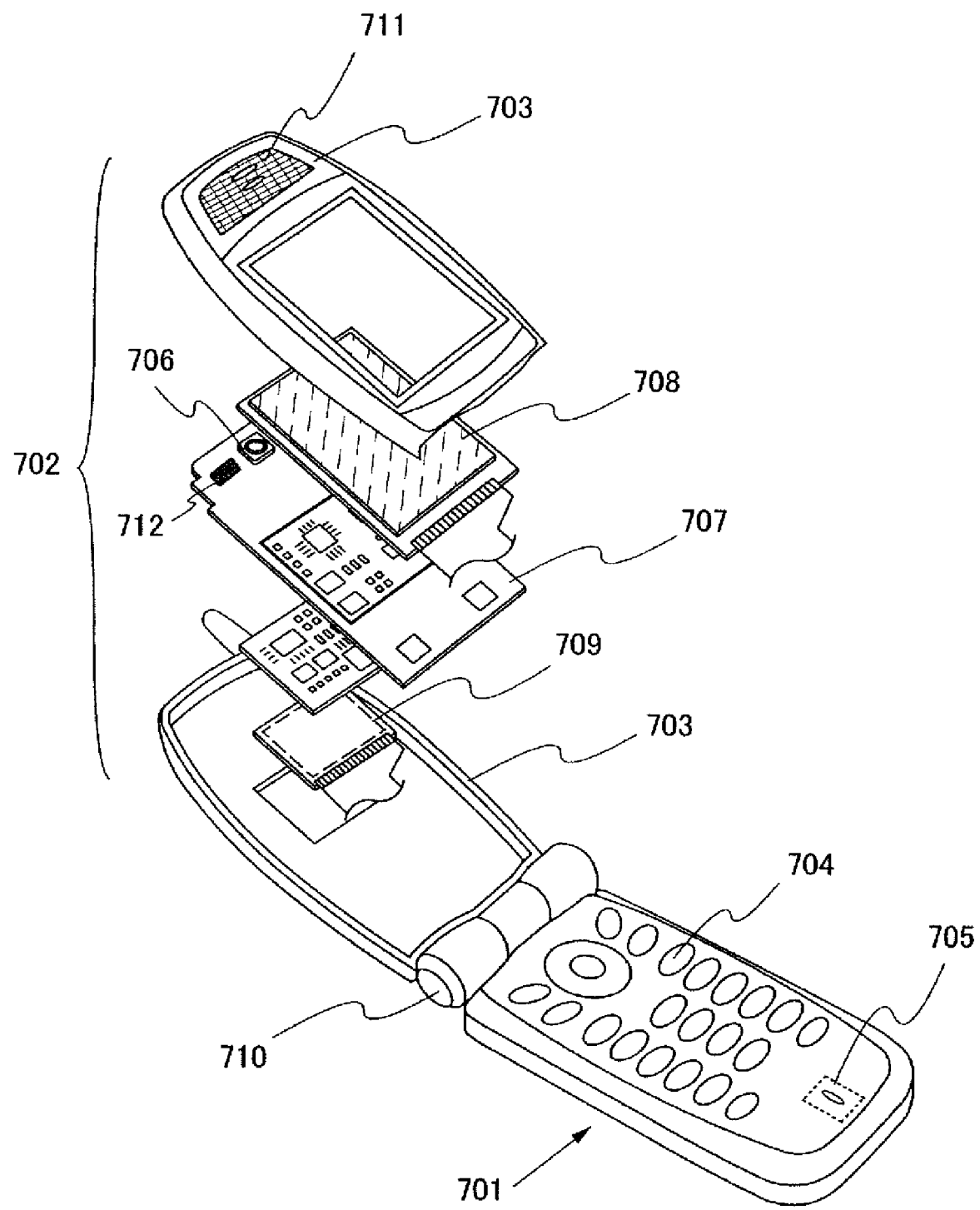
FIG. 16 is a diagram illustrating a device provided with a photoelectric conversion device of the present invention.

FIG. 16 shows a mobile phone which includes a main body (A) 701, a main body (B) 702, a housing 703, operation keys 704, an audio input portion 705, an audio output portion 706, a circuit substrate 707, a display panel (A) 708, a display panel (B) 709, a hinge 710, a light-transmitting material portion 711, and a photoelectric conversion device 712. The present invention can be applied to the photoelectric conversion device 712.

The photoelectric conversion device 712 detects light which is transmitted through the light-transmitting material portion 711, controls luminance of the display panel (A) 708 and the display panel (B) 709 in accordance with illuminance of detected external light, and controls illumination of the operation keys 704 in accordance with illuminance obtained by the photoelectric conversion device 712. Thus, current consumption of the mobile phone can be reduced.

Figure 17A:
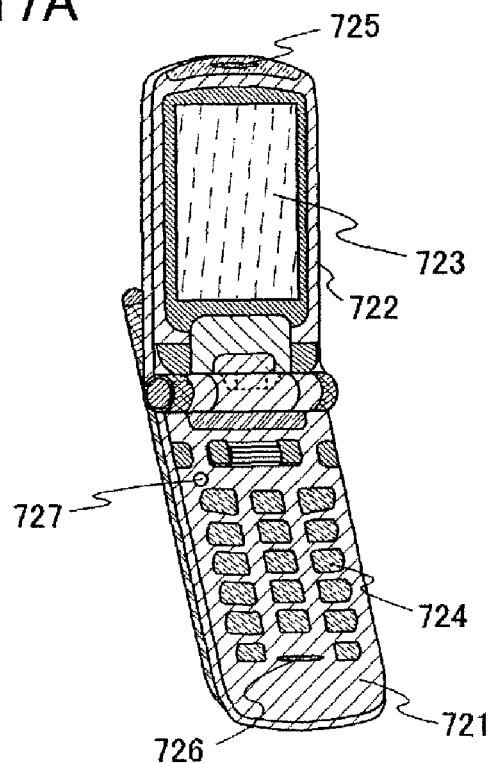
FIGS. 17A and 17B are diagrams each illustrating a device provided with a photoelectric conversion device of the present invention.
Figure 17B:
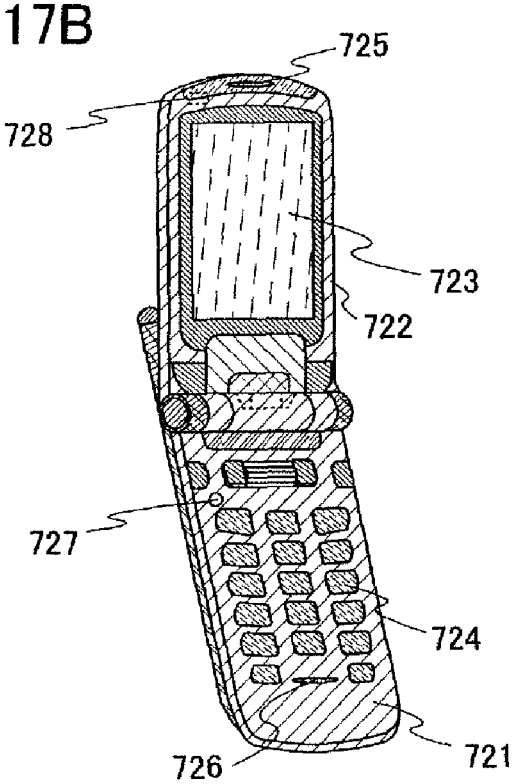

Next, FIGS. 17A and 17B show other examples of a mobile phone. In FIGS. 17A and 17B, a reference numeral 721 denotes a main body; a reference numeral 722 denotes a housing; a reference numeral 723 denotes a display panel; a reference numeral 724 denotes operation keys; a reference numeral 725 denotes an audio output portion; a reference numeral 726 denotes an audio input portion; and reference numerals 727 and 728 denote photoelectric conversion devices.

In the mobile phone shown in FIG. 17A, luminance of the display panel 723 and the operation keys 724 can be controlled by detecting external light with the photoelectric conversion device 727 provided in the main body 721.

In the mobile phone shown in FIG. 17B, the photoelectric conversion device 728 is provided inside the main body 721 in addition to the structure of FIG. 17A. By the photoelectric conversion device 728, luminance of a backlight provided for the display panel 723 can be detected.

Figure 18A:
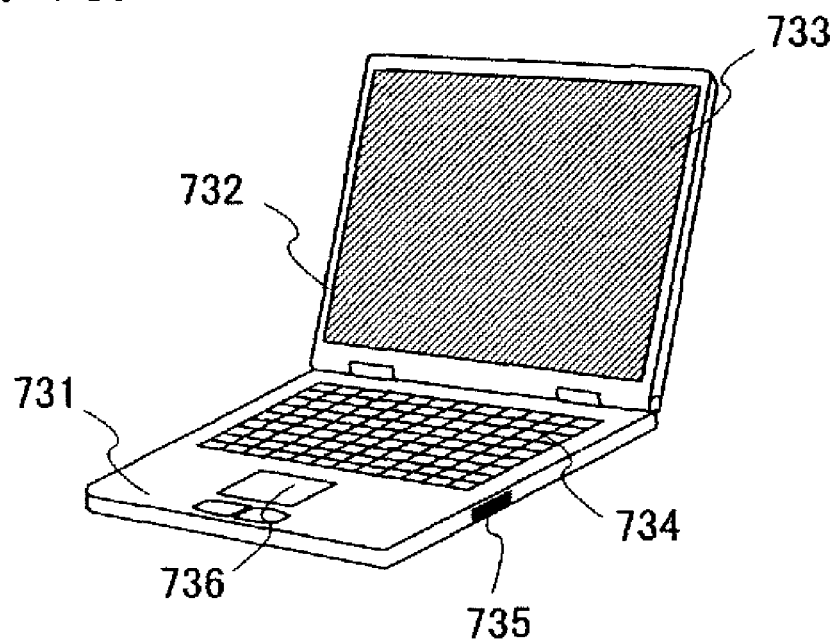
FIGS. 18A and 18B are diagrams each illustrating a device provided with a photoelectric conversion device of the present invention.

FIG. 18A shows a computer, which includes a main body 731, a housing 732, a display portion 733, a keyboard 734, an external connection port 735, a pointing device 736, and the like.

Figure 18B:
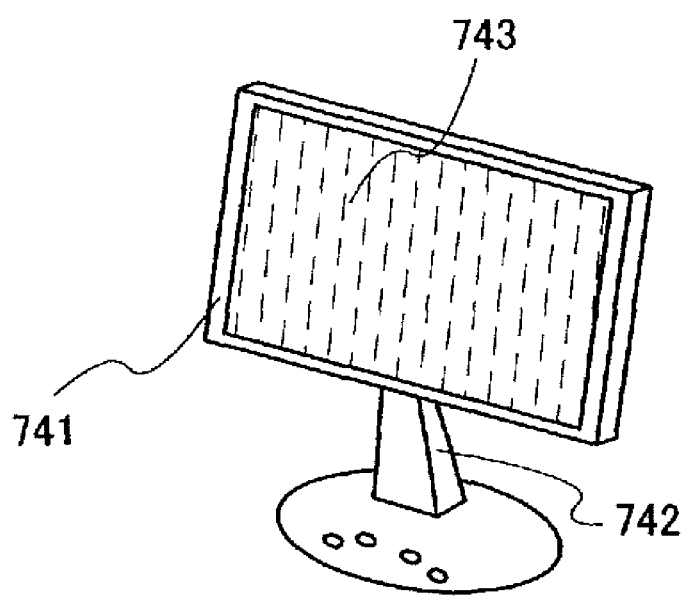

FIG. 18B shows a display device, and a TV receiver or the like corresponds to this. The display device includes a housing 741, a support base 742, a display portion 743, and the like.

Figure 19:
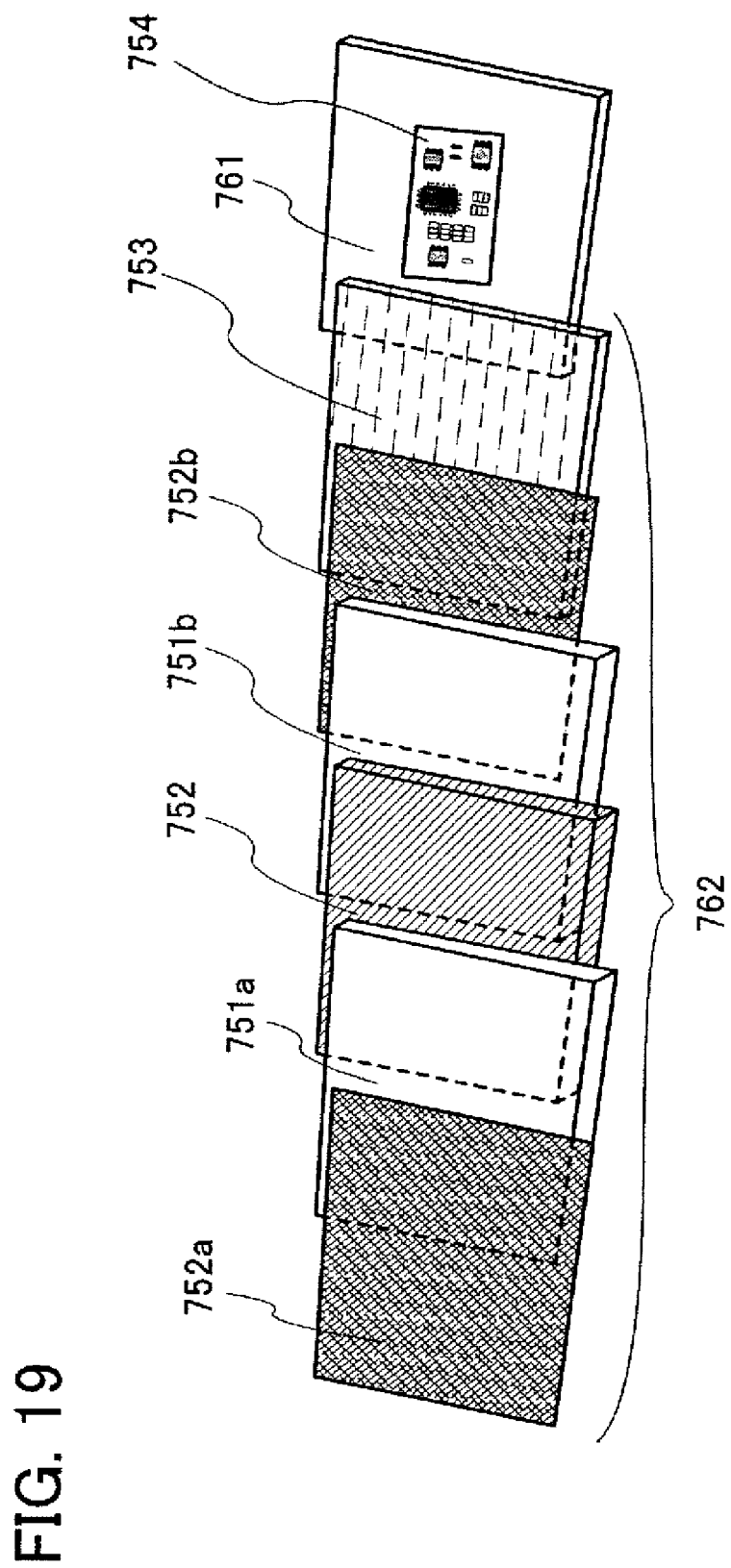
FIG. 19 is a diagram illustrating a device provided with a photoelectric conversion device of the present invention.

FIG. 19 shows a specific structure of the case where a liquid crystal panels is used for the display portion 733 provided in the computer of FIG. 18A and the display portion 743 of the display device shown in FIG. 18B.

A liquid crystal panel 762 shown in FIG. 19 is incorporated in a housing 761 and includes substrates 751a and 751b, a liquid crystal layer 752 sandwiched between the substrates 751a and 751b, polarizing filters 752a and 752b, a backlight 753, and the like. An photoelectric conversion device 754 is formed in the housing 761.

The photoelectric conversion device 754 which is manufactured using the present invention detects the amount of light from the backlight 753, and luminance of the liquid crystal panel 762 is adjusted when information thereof is fed back.

Figure 20A:
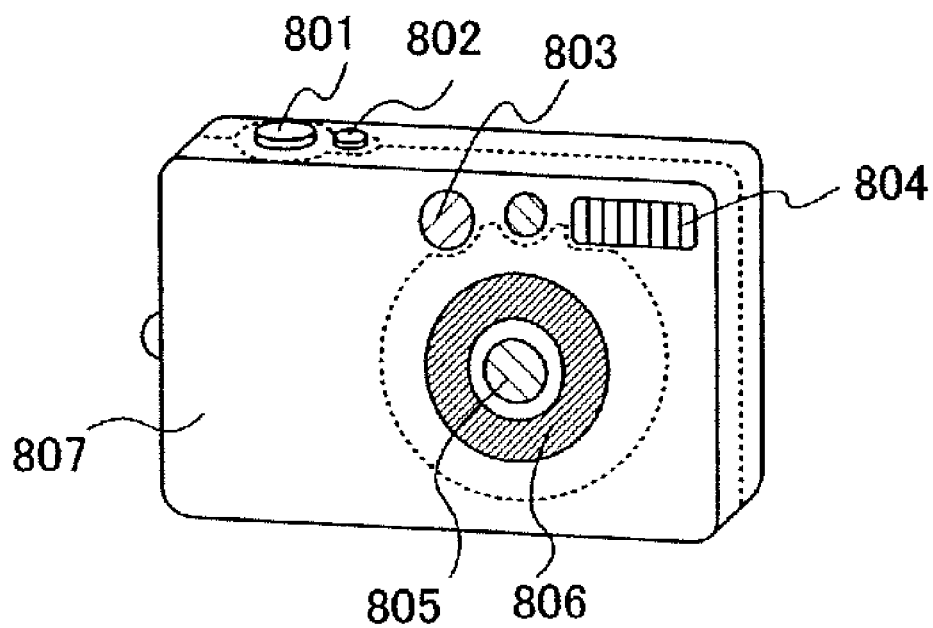
FIGS. 20A and 20B are diagrams illustrating a device provided with a photoelectric conversion device of the present invention.
Figure 20B:
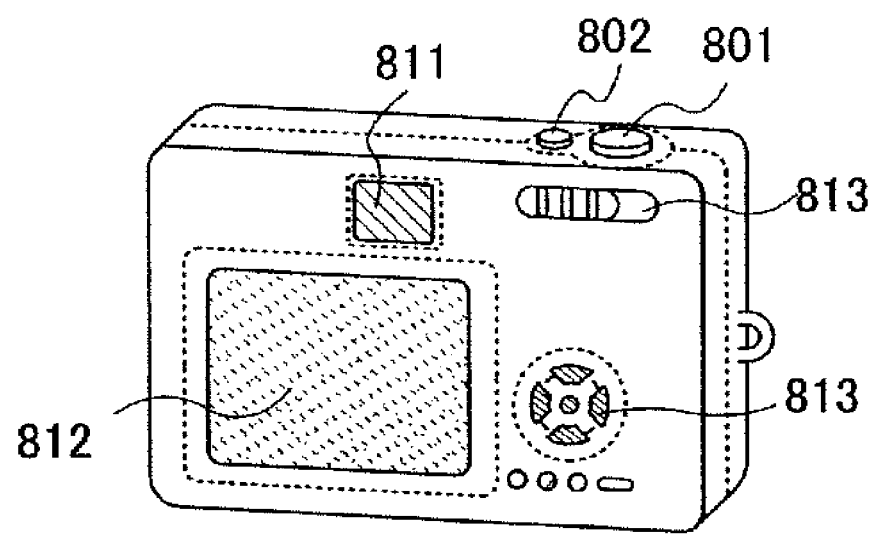

FIGS. 20A and 20B are diagrams each showing an example in which the photoelectric conversion device of the present invention is incorporated in a camera such as a digital camera. FIG. 20A is a front perspective view of the digital camera, and FIG. 20B is a back perspective view of the digital camera. In FIG. 20A, the digital camera includes a release button 801, a main switch 802, a finder window 803, a flash portion 804, a lens 805, a lens barrel 806, and a housing 807.

In addition, as shown in FIG. 20B, a finder eyepiece window 811, a monitor 812, and operation buttons 813 are included.

When the release button 801 is pressed down halfway, a focusing adjusting mechanism and an exposure adjusting mechanism are operated, and a shutter is opened when the release button is fully pressed down.

The main switch 802 switches ON/OFF of a power source of the digital camera by being pressed or rotated.

The finder window 803 is provided above the lens 805 of a front side of the digital camera, and is a device for confirming an area which is photographed or a focus position from the finder eyepiece window 811 shown in FIG. 20B.

The flash portion 804 is provided at the upper portion of the front side of the digital camera, and when luminance of an object is low, auxiliary light is emitted at the same time as the release button is pressed down and the shutter is opened.

The lens 805 is provided at the front face of the digital camera. The lens 805 includes a focusing lens, a zoom lens, or the like, and forms a photographing optical system with a shutter and a diaphragm which are not shown. In addition, an image pickup device such as CCD (charge coupled device) is provided at the back of the lens 805.

The lens barrel 806 moves a position of the lens 805 to adjust the focus of the focusing lens, the zoom lens, or the like. At the time of photographing, the lens barrel 806 is slid out to move the lens 805 forward. Further, when the camera is carried, the lens 805 is moved backward and made compact. Note that although a structure in which the lens barrel is slid out so that an object can be enlarged and photographed is employed in this embodiment mode, the present invention is not limited this structure. A structure may be employed in which zoom shooting can be performed without sliding out the lens barrel by using the photographing optical system inside the housing 807.

The finder eyepiece window 811 is provided at the upper portion of the back surface of the digital camera and is a window for looking through when recognizing an area which is taken or a focus point.

The operation buttons 813 are buttons for various functions which are provided at the back surface of the digital camera and include a setup button, a menu button, a display button, a functional button, a selection button, and the like.

When a photoelectric conversion device of the present invention is incorporated in the camera shown in FIGS. 20A and 20B, the photoelectric conversion device can detect existence or nonexistence of light and light intensity, so that exposure adjustment or the like of the camera can be performed. In the photoelectric conversion device of the present invention, the output which is almost in proportion to the logarithm of the illuminance can be obtained and an illuminance range which is applicable for the photoelectric conversion device can be widened.

In addition, the photoelectric conversion device of the present invention can be applied to other electronic devices such as a projection television and a navigation system. That is, the optical sensor of the present invention can be used for any device where light is necessary to be detected.

Note that this embodiment mode can be combined with the technical features of the other embodiment modes in this specification.

This application is based on Japanese Patent Application serial no. 2007-193015 filed with Japan Patent Office on Jul. 25, 2007 and Japanese Patent Application serial no. 2007-193151 filed with Japan Patent Office on Jul. 25, 2007, the entire contents of which are hereby incorporated by reference.

The invention claimed is:

1. A photoelectric conversion device comprising:
a photoelectric conversion element;
a first transistor configured to refer an illuminance-current generated at the photoelectric conversion element;
a first output generation circuit;
a second output generation circuit;
a load resistor; and
an output terminal,
wherein the photoelectric conversion element is electrically connected to the first transistor,
wherein the first output generation circuit and the second output generation circuit each includes a second transistor and an internal resistor electrically connected in series, and a first terminal of the internal resistor is electrically connected to a first electrode of the second transistor,
wherein a gate electrode of the first transistor is electrically connected to a gate electrode of each of the second transistors,
wherein a second terminal of each of the internal resistors is electrically connected to a first terminal of the load resistor,
wherein a first electrode of the first transistor and a second electrode of each of the second transistors are electrically connected to a first power supply line,
wherein a second terminal of the load resistor is electrically connected to a second power supply line,
wherein the first terminal of the load resistor is electrically connected to the output terminal, and
wherein ratios of a channel length L to a channel width W, $\alpha=W/L$, of the second transistors are different from each other.

2. The photoelectric conversion device according to claim 1,
wherein a first electrode of the photoelectric conversion element is electrically connected to the first terminal of the first transistor,
wherein a second terminal of the first transistor is electrically connected to the second power supply line, and
wherein a second electrode of the photoelectric conversion element is electrically connected to the second power supply line.

3. The photoelectric conversion device according to claim 2 further comprising a third transistor and a fourth transistor,
wherein a first terminal of the third transistor is electrically connected to a gate electrode of the third transistor and the second electrode of the photoelectric conversion element,
wherein a first terminal of the fourth transistor is electrically connected to the second terminal of the first transistor,
wherein a gate electrode of the fourth transistor is electrically connected to the gate electrode of the third transistor, and
wherein a second terminal of the fourth transistor is electrically connected to the second power supply line.

4. The photoelectric conversion device according to claim 1,
wherein the ratio $\alpha$ of the second transistor of the first output generation circuit is approximately ten times as large as the ratio $\alpha$ of the second transistor of the second output generation circuit.

5. The photoelectric conversion device according to claim 1,
wherein the first transistor is a thin film transistor.

6. The photoelectric conversion device according to claim 1,
wherein the photoelectric conversion element, the first transistor, the first output generation circuit, the second output generation circuit, the load resistor, and the output terminal are provided over a light-transmitting substrate.

7. An electronic device comprising a display portion having the photoelectric conversion device according to claim 1.

8. A photoelectric conversion device comprising:
a photoelectric conversion element;
a first transistor;
a first output generation circuit;
a second output generation circuit;
a load resistor; and
an output terminal,
wherein the first output generation circuit and the second output generation circuit each includes a second transistor and an internal resistor electrically connected in series, and a first terminal of the internal resistor is electrically connected to a first electrode of the second transistor, wherein a first electrode of the photoelectric conversion element is electrically connected to a first electrode and a gate electrode of the first transistor, wherein a second terminal of each of the internal resistors is electrically connected to a first terminal of the load resistor, wherein a second electrode of the first transistor and a second electrode of each of the second transistors are electrically connected to a first power supply line, wherein the gate electrode of the first transistor and a gate electrode of each of the second transistors are electrically connected each other, wherein a second electrode of the photoelectric conversion element and a second terminal of the load resistor are electrically connected to a second power supply line, wherein the first terminal of the load resistor are electrically connected to the output terminal, and wherein ratios of a channel length L to a channel width W, α=W/L, of the second transistors are different from each other.

9. The photoelectric conversion device according to claim 8, wherein the ratio α of the second transistor of the first output generation circuit is approximately ten times as large as the ratio α of the second transistor of the second output generation circuit.

10. The photoelectric conversion device according to claim 8, wherein the first transistor is a thin film transistor.

11. The photoelectric conversion device according to claim 8, wherein the photoelectric conversion element, the first transistor, the first output generation circuit, the second output generation circuit, the load resistor, and the output terminal are provided over a light-transmitting substrate.

12. An electronic device comprising a display portion having the photoelectric conversion device according to claim 8.

13. A photoelectric conversion device comprising:
a photoelectric conversion element;
a first transistor which is a p-channel field effect transistor;
a first output generation circuit;
a second output generation circuit;
a load resistor; and
an output terminal, wherein the first output generation circuit and the second output generation circuit each includes a second transistor which is a p-channel field effect transistor and an internal resistor first terminal of which is electrically connected to a first electrode of the second transistor, wherein a cathode of the photoelectric conversion element s electrically connected to a first electrode and a gate electrode of the first transistor and a gate electrode of each of the second transistors, wherein a second terminal of each of the internal resistors is electrically connected to a first terminal of the load resistor, wherein a second electrode of the first transistor and a second electrode of each of the second transistors are electrically connected to a high potential side power supply line, wherein an anode of the photoelectric conversion element and a second terminal of the load resistor are electrically connected to a low potential side power supply line, wherein the first terminal of the load resistor is electrically connected to the output terminal, and wherein ratios of a channel length L to a channel width W, α=W/L, of the second transistors are different from each other.

14. The photoelectric conversion device according to claim 13, wherein the ratio α of the second transistor of the first output generation circuit is approximately ten times as large as the ratio α of the second transistor of the second output generation circuit.

15. The photoelectric conversion device according to claim 13, wherein the p-channel field effect transistor is a thin film transistor.

16. The photoelectric conversion device according to claim 13, wherein the photoelectric conversion element, the first transistor, the first output generation circuit, the second output generation circuit, the load resistor, and the output terminal are provided over a light-transmitting substrate.

17. An electronic device comprising a display portion having the photoelectric conversion device according to claim 13.

18. A photoelectric conversion device comprising:
a photoelectric conversion element;
a first transistor which is an n-channel field effect transistor;
a first output generation circuit;
a second output generation circuit;
a load resistor; and
an output terminal, wherein the first output generation circuit and the second output generation circuit each includes a second transistor which is an n-channel field effect transistor and an internal resistor a first terminal of which is electrically connected to a first electrode of the second transistor, wherein an anode of the photoelectric conversion element is electrically connected to a first electrode and a gate electrode of the first transistor and a gate electrode of each of the second transistors, wherein a second terminal of each of the internal resistors is electrically connected to a first terminal of the load resistor, wherein a cathode of the photoelectric conversion element and a second terminal of the load resistor are electrically connected to a high potential side power supply line, wherein a second electrode of the first transistor and a second electrode of each of the second transistors are electrically connected to a low potential side power supply line, wherein the first terminal of the load resistor is electrically connected to the output terminal, and wherein ratios of a channel length L to a channel width W, α=W/L, of the second transistors are different from each other.

19. The photoelectric conversion device according to claim 18, wherein the ratio α of the second transistor of the first output generation circuit is approximately ten times as large as the ratio α of the second transistor of the second output generation circuit.

20. The photoelectric conversion device according to claim 18, wherein the n-channel field effect transistor is a thin film transistor.

21. The photoelectric conversion device according to claim 18, wherein the photoelectric conversion element, the first transistor, the first output generation circuit, the second output generation circuit, the load resistor, and the output terminal are provided over a light-transmitting substrate.

22. An electronic device comprising a display portion having the photoelectric conversion device according to claim 18.

23. A photoelectric conversion device comprising:
a photoelectric conversion element;
a first transistor which is a p-channel field effect transistor;
a second transistor which is an n-channel field effect transistor;
a third transistor which is an n-channel field effect transistor;
a first output generation circuit;
a second output generation circuit;
a load resistor; and
an output terminal,
wherein the first output generation circuit and the second output generation circuit each includes a fourth transistor which is a p-channel field effect transistor and an internal resistor a first terminal of which is electrically connected to a first electrode of the fourth transistor,
wherein an anode of the photoelectric conversion element is electrically connected to a first electrode and a gate electrode of the second transistor,
wherein the gate electrode of the second transistor is electrically connected to a gate electrode of the third transistor,
wherein a first electrode of the third transistor is electrically connected to a first electrode and a gate electrode of the first transistor and a gate electrode of the fourth transistor,
wherein a second terminal of the internal resistor is electrically connected to a first terminal of the load resistor,
wherein a cathode of the photoelectric conversion element, a second electrode of the first transistor, and a second electrode of the fourth transistor are electrically connected to a high potential side power supply line,
wherein a second electrode of the second transistor, a second electrode of the third transistor and a second terminal of the load resistor are electrically connected to a low potential side power supply line,
wherein the first terminal of the load resistor is electrically connected to the output terminal, and
wherein ratios of a channel length L to a channel width W, $\alpha = W/L$, of the fourth transistors are different from each other.

24. The photoelectric conversion device according to claim 23,
wherein the ratio $\alpha$ of the second transistors are different from each other fourth transistor of the first output generation circuit is approximately ten times as large as the ratio $\alpha$ of the fourth transistor of the second output generation circuit.

25. The photoelectric conversion device according to claim 23,
wherein each of the p-channel field effect transistor and the n-channel field effect transistor is a thin film transistor.

26. The photoelectric conversion device according to claim 23,
wherein the photoelectric conversion element, the first transistor, the second transistor, the third transistor, the first output generation circuit, the second output generation circuit, the load resistor, and the output terminal are provided over a light-transmitting substrate.

27. An electronic device comprising a display portion having the photoelectric conversion device according to claim 23.

28. A photoelectric conversion device comprising:
a photoelectric conversion element;
a first transistor which is an n-channel field effect transistor;
a second transistor which is a p-channel field effect transistor;
a third transistor which is a p-channel field effect transistor;
a first output generation circuit;
a second output generation circuit;
a load resistor; and
an output terminal,
wherein the first output generation circuit and the second output generation circuit each includes a fourth transistor which is an n-channel field effect transistor and an internal resistor a first terminal of which is electrically connected to a first electrode of the fourth transistor,
wherein a cathode of the photoelectric conversion element is electrically connected to a first electrode and a gate electrode of the second transistor,
wherein the gate electrode of the second transistor is electrically connected to a gate electrode of the third transistor,
wherein a first electrode of the third transistor is electrically connected to a first electrode and a gate electrode of the first transistor and a gate electrode of each of the fourth transistor,
wherein a second terminal of each of the internal resistor is electrically connected to a first terminal of the load resistor,
wherein an anode of the photoelectric conversion element, a second electrode of the first transistor and a second electrode of each of the fourth transistor are electrically connected to a low potential side power supply line,
wherein a second electrode of the second transistor, a second electrode of the third transistor and a second terminal of the load resistor are electrically connected to a high potential side power supply line,
wherein the first terminal of the load resistor is electrically connected to the output terminal, and
wherein ratios of a channel length L to a channel width W, $\alpha = W/L$, of the fourth transistors are different from each other.

29. The photoelectric conversion device according to claim 28,
wherein the ratio $\alpha$ of the fourth transistor of the first output generation circuit is approximately ten times as large as the ratio $\alpha$ of the fourth transistor of the second output generation circuit.

30. The photoelectric conversion device according to claim 28,
wherein each of the p-channel field effect transistor and the n-channel field effect transistor is a thin film transistor.

31. The photoelectric conversion device according to claim 28,
wherein the photoelectric conversion element, the first transistor, the second transistor, the third transistor, the first output generation circuit, the second output generation circuit, the load resistor, and the output terminal are provided over a light-transmitting substrate.

32. An electronic device comprising a display portion having the photoelectric conversion device according to claim 28.

* * * * *